(12) United States Patent
Khozikov et al.

(10) Patent No.: US 12,348,063 B2
(45) Date of Patent: Jul. 1, 2025

(54) SYSTEMS AND METHODS FOR FAIL-SAFE BATTERY PROTECTION INDEPENDENT FROM BATTERY MANAGEMENT SYSTEM

(71) Applicant: The Boeing Company, Chicago, IL (US)

(72) Inventors: Vyacheslav Khozikov, Bellevue, WA (US); Frederic Lacaux, Woodinville, WA (US); Eugene V. Solodovnik, Lake Stevens, WA (US); John A. Trela, Seattle, WA (US); Kolten C. Miller, Snoqualmie, WA (US); Kamiar J. Karimi, Kirkland, WA (US)

(73) Assignee: The Boeing Company, Arlington, VA (US)

( * ) Notice: Subject to any disclaimer, the term of this patent is extended or adjusted under 35 U.S.C. 154(b) by 702 days.

(21) Appl. No.: 17/578,000

(22) Filed: Jan. 18, 2022

(65) Prior Publication Data

US 2022/0255335 A1 Aug. 11, 2022

Related U.S. Application Data

(60) Provisional application No. 63/148,302, filed on Feb. 11, 2021.

(51) Int. Cl.
| | | |
|---|---|---|
| *H02J 7/00* | (2006.01) | |
| *G01R 31/3835* | (2019.01) | |
| *G01R 31/396* | (2019.01) | |
| *H02J 3/32* | (2006.01) | |

(52) U.S. Cl.
CPC ...... *H02J 7/00302* (2020.01); *G01R 31/3835* (2019.01); *G01R 31/396* (2019.01);
(Continued)

(58) Field of Classification Search
CPC .......................... H02J 7/00302; G01R 31/396
(Continued)

(56) References Cited

U.S. PATENT DOCUMENTS

| | | | |
|---|---|---|---|
| 4,941,079 A | 7/1990 | Ooi | |
| 6,532,425 B1 * | 3/2003 | Boost | G01R 31/3648 |
| | | | 320/136 |

(Continued)

FOREIGN PATENT DOCUMENTS

| | | |
|---|---|---|
| CN | 107394092 A | 11/2017 |
| CN | 105684254 B | 5/2018 |
| JP | 2014225950 A | 12/2014 |

OTHER PUBLICATIONS

Extended European Search Report (EESR) issued on Jul. 8, 2022, in European Patent Application No. 22154984.3 (European counterpart of the instant U.S. patent application).

*Primary Examiner* — Jack Chiang
*Assistant Examiner* — Suchin Parihar
(74) *Attorney, Agent, or Firm* — Harrity & Harrity, LLP

(57) ABSTRACT

Methods and systems for charging a battery string while protecting against overcharging. One system includes: a pair of disconnect devices; a power distribution bus which is electrically connected to a battery string via the disconnect devices; a battery charger connected to supply battery power to the power distribution bus for charging the battery string; a module monitoring unit configured to sense individual battery cell voltages during charging; a first processor configured to activate one disconnect device to open when the sensed individual battery cell voltages indicate overcharging; a plurality of sensors connected to sense a full-string voltage measured across the battery string and first and second half-string voltages measured across first and second half-strings of the battery string; and a second processor connected to receive sensor data during charging. The (Continued)

second processor is configured to independently activate the second disconnect device to open when the sensor data indicates continued overcharging.

23 Claims, 15 Drawing Sheets

(52) U.S. Cl.
CPC .......... *H02J 7/0013* (2013.01); *H02J 7/0031* (2013.01); *H02J 7/0048* (2020.01); *H02J 3/32* (2013.01)

(58) Field of Classification Search
USPC .......................................................... 320/134
See application file for complete search history.

(56) References Cited

U.S. PATENT DOCUMENTS

| | | |
|---|---|---|
| 8,212,371 B2 | 7/2012 | Maibach et al. |
| 9,525,291 B1* | 12/2016 | Huynh ..................... B60L 3/04 |
| 10,589,635 B1 | 3/2020 | Solodovnik et al. |
| 2006/0051660 A1* | 3/2006 | Chang .................. H01M 10/425 |
| | | 337/183 |
| 2015/0115108 A1 | 4/2015 | Benson et al. |
| 2016/0141894 A1* | 5/2016 | Beaston ................ H02J 7/0014 |
| | | 320/103 |
| 2016/0211698 A1* | 7/2016 | Nandam ................ H02J 7/0068 |
| 2017/0102435 A1* | 4/2017 | Hanking ............... G01R 31/396 |
| 2017/0358934 A1* | 12/2017 | Miller ................... H02J 7/0024 |
| 2018/0123357 A1 | 5/2018 | Beaston ................. H02J 3/381 |
| 2018/0217206 A1 | 8/2018 | Kiuchi et al. |
| 2019/0176803 A1 | 6/2019 | Tabatowshi-Bush et al. |
| 2021/0083505 A1* | 3/2021 | Beaston ................. H02J 3/381 |
| 2022/0115878 A1* | 4/2022 | Khozikov ............. H02J 7/0031 |
| 2023/0059046 A1* | 2/2023 | Khozikov ............. G01R 15/04 |
| 2023/0275422 A1* | 8/2023 | Holveck ................ H02M 1/36 |
| | | 361/87 |
| 2024/0175932 A1* | 5/2024 | Fechalos ............... H02J 7/0014 |

* cited by examiner

SYSTEMS AND METHODS FOR FAIL-SAFE BATTERY PROTECTION INDEPENDENT FROM BATTERY MANAGEMENT SYSTEM

RELATED PATENT APPLICATION

This application claims the benefit, under Title 35, United States Code, Section 119 (e), of U.S. Provisional Application No. 63/148,302 filed on Feb. 11, 2021.

BACKGROUND

This disclosure generally relates to systems and methods for mitigating overcharging during controlled or uncontrolled charging of a modular battery system onboard a vehicle, such as an aircraft.

When electric motors are used for propulsion of the aircraft, electrical energy is supplied by a power source. For instance, electrical energy may be supplied by a DC power source that includes strings of battery modules. As used herein, the term "battery module" means a battery that includes a single battery cell or a multiplicity of battery cells wired in series, parallel, or a mixture thereof. As used herein, the term "battery string" means a plurality of battery modules wired in series. In one implementation, the battery strings provide high-voltage direct-current (HVDC) power when connected to a power distribution bus by means of the closure of intervening switches or contactors. As used herein, the term "connected" means coupled for supplying electrical power and the term "disconnected" means decoupled to not supply electrical power. As used herein, the term "high voltage" in the context of direct current practically means any DC voltage higher than 600 $V_{DC}$.

In some aircraft having an all-electric or a hybrid electric propulsive system, high-capacity high-voltage (e.g., 600/1000/2000 $V_{DC}$) battery packs are used to provide power to large electric motors. Aircraft battery packs may have architectures with multiple strings arranged in parallel to ensure sufficient power flow into a load(s) at a fixed level of operation. In airborne applications, levels of safety and criticality for high-power/high-voltage electrical protections are stringent, requiring multiple dissimilar redundant protections, including fail-safe and shutdown mechanisms. (As used herein, the term "fail-safe" means a design feature or practice which, in the event of a specific type of failure, inherently responds in a way that will prevent or mitigate unsafe consequences of the system's failure.) Airborne applications require an extremely high level of criticality and integrity for battery overcharge protection or other events or combination of events that could lead to battery thermal runaway.

A battery (e.g., a lithium-ion battery) can be charged by battery charger electronics and by HVDC loads during either a normal regeneration mode or a failure mode. A battery management system (BMS), as a first layer of protection, typically includes redundant monitoring and protection using individual cell voltages to protect against overcharge using dual battery management units (hereinafter "module monitoring units"). For aircraft application, an additional independent and dissimilar fail-safe layer separated from the battery management units is required to provide a double- or triple-redundant solution compatible with CAT III airworthiness requirements (e.g., failure probability less than $10^{-9}$).

In particular, a solution is desired to the problem of providing redundant, independent, and fail-safe operation during charging of an aircraft's battery to mitigate various scenarios. A lithium-ion battery overcharge condition can be created by at least three different types of failure event: (1) battery charger regulation circuit failure resulting in a battery charging voltage higher than the end-of-charge voltage; (2) battery internal failure resulting in fewer cells connected in series and the battery charger operating in its normal end-of-charge voltage band (for example, a short circuit of one battery module cleared by an internal fusible link); and (3) uncontrollable regeneration of power fed back into the battery, for example, in the case of failure or malfunction of the motor and/or inverter. This is an important aspect of both on-the-ground and in-flight operations because current trends are aimed to reduce battery charging time by utilizing, for example, high-voltage fast chargers which are intrinsically less accurately controlled or their controls require more reliable and expensive solutions.

Currently, the protection function during charging is implemented by the module management units (hereinafter "MMUs") of the BMS at a source of charging (such as a battery charger) or at an actively controlled load (if capable of regenerative charging). Typically, the MMUs are designed to detect these overcharge conditions by monitoring each individual cell voltage and isolating the battery. Also, the solution implemented in MMUs relies on monitoring individual battery cells, which increases the cost of the battery system and decreases the reliability of the system when operating voltage increases (proportional to the increase in the number of series-connected cells required to reach operating voltage). An additional layer of protection and isolation (fail-safe type) independent and dissimilar from the MMUs would provide additional safety for the above-described overcharge conditions.

SUMMARY

The subject matter disclosed in some detail below is directed to systems and methods for providing redundant and dissimilar protection against overcharging of airborne high-voltage battery packs (such as battery packs for airborne electric propulsion systems). As used herein, the term "battery pack" includes a single battery string or a plurality of battery strings wired in parallel, each battery string including a plurality of series-connected battery modules. The battery overcharge protection scheme proposed herein includes an additional independent and dissimilar fail-safe layer separate from the module management units (MMUs) to provide a double- or triple-redundant solution compatible with CAT III airworthiness requirements. The additional fail-safe layer is robust and simple. Preferably, the additional fail-safe layer does not use individual cell voltage sensing.

In accordance with some embodiments, the system and method include battery protection devices that are connected and configured to provide redundant and dissimilar protection against overcharging of a battery pack during battery charging and discharging cycles. The battery protection devices proposed herein are external to the battery management system, yet provide independent fail-safe protection of the battery against overcharging.

The proposed design of an independent fail-safe triple-redundant battery protection system is implemented using a solution which is dissimilar from a typical battery protection system. In accordance with some embodiments, a fail-safe device uses voltage transducers to measure the half-string voltages from a mid-tap of the battery string to the positive and negative busbars respectively, as well as the voltage across the entire string (the potential difference between the positive and negative busbars). The voltages are processed by hardware (e.g., a field-programmable gate array) or by software in a way dissimilar to the processing implemented in the MMU and in a charger inside the fail-safe device and compared to predetermined threshold value levels. The threshold value levels are dynamically calculated to monitor whether the voltages are within safety margins or not. The safety margins are defined to prevent: (a) battery overvoltage from the positive side to the negative side; and (b) unbalance between the voltages of two half-strings of the same battery string during charging and discharging cycles. Upon detecting an abnormal regime, a fail-safe controller commands internal independent disconnect devices to open, thereby clearing the faulted state (e.g., by isolating the fault). The fail-safe device can be implemented in a dedicated enclosure or embedded inside an aircraft power distribution panel.

Although various embodiments of systems and methods for providing redundant and dissimilar protection against overcharging of airborne high-voltage battery packs will be described in some detail below, one or more of those embodiments may be characterized by one or more of the following aspects.

One aspect of the subject matter disclosed in detail below is a system for charging a battery string that comprises first and second half-strings electrically connected at a mid-point, each half-string comprising a respective plurality of battery modules connected in series, each battery module comprising a respective plurality of battery cells, the system comprising: a first plurality of sensors connected to sense a full-string voltage measured across the battery string, a first half-string voltage measured across the first half-string, and a second half-string voltage measured across the second half-string; a failsafe overcharge system comprising a first disconnect device and a processor connected to receive sensor data from the first plurality of sensors during charging and send commands to the first disconnect device, a power distribution bus which is electrically connected to the battery string via the first disconnect device when the first disconnect device is closed; and a battery charger connected and configured to supply battery power to the power distribution bus for charging of the battery string. The processor of the failsafe overcharge system is configured to send a command to open the first disconnect device when the sensor data from the first plurality of sensors indicates an undesirable electrical state during charging that would be mitigated by cessation of charging. More specifically, the processor of the failsafe overcharge system is programmed to derive a first measurement from the sensor data, compare the first measurement to a first threshold value, and send the command to open the first disconnect device when the first measurement exceeds the first threshold value.

In accordance with some embodiments, the system described in the immediately preceding paragraph further comprises a second disconnect device via which the power distribution bus is electrically connected to the battery string when the first and second disconnect devices are closed. In this case, the processor of the failsafe overcharge system is further programmed to derive a second measurement from the sensor data, compare the second measurement value to a second threshold value which is higher than the first threshold value, and send a command to open the second disconnect device when the second measurement exceeds the second threshold value. In one proposed implementation, the first disconnect device is a contactor and the second disconnect device is a pyro switch.

Another aspect of the subject matter disclosed in detail below is a method for charging a battery string that comprises first and second half-strings electrically connected at a mid-point, each half-string comprising a respective plurality of battery modules connected in series, each battery module comprising a respective plurality of battery cells. The method comprises: charging the battery string via a first disconnect device in a closed state; measuring a first half-string voltage across the first half-string during charging; measuring a second half-string voltage across the first half-string during charging; calculating a difference between the measured first and second half-string voltages; comparing the difference to a difference threshold value; and issuing a command to the first disconnect device to open in response to the difference being greater than the difference threshold value.

A further aspect of the subject matter disclosed in detail below is a system for charging a battery string that comprises first and second half-strings electrically connected at a mid-point, each half-string comprising a respective plurality of battery modules connected in series, each battery module comprising a respective plurality of battery cells, the system comprising: first and second disconnect devices; a power distribution bus which is electrically connected to the battery string via the first and second disconnect devices when the first and second disconnect devices are closed; a battery charger connected and configured to supply battery power to the power distribution bus for charging of the battery string; a module monitoring unit which is configured to sense individual battery cell voltages of the battery cells during charging; a first processor configured to activate the first disconnect device to open when the individual battery cell voltages sensed by the module monitoring unit indicate overcharging; a plurality of sensors connected to sense a full-string voltage measured across the battery string, a first half-string voltage measured across the first half-string, and a second half-string voltage measured across the second half-string; and a second processor connected to receive sensor data from the plurality of sensors during charging and configured to activate the second disconnect device to open when the sensor data indicates overcharging.

Other aspects of systems and methods for providing redundant and dissimilar protection against overcharging of airborne high-voltage battery packs are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams are drawn to scale.

Reference will hereinafter be made to the drawings in which similar elements in different drawings bear the same reference numerals.

DETAILED DESCRIPTION

Illustrative embodiments of systems and methods for providing redundant and dissimilar protection against overcharging of airborne high-voltage battery packs are described in some detail below. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
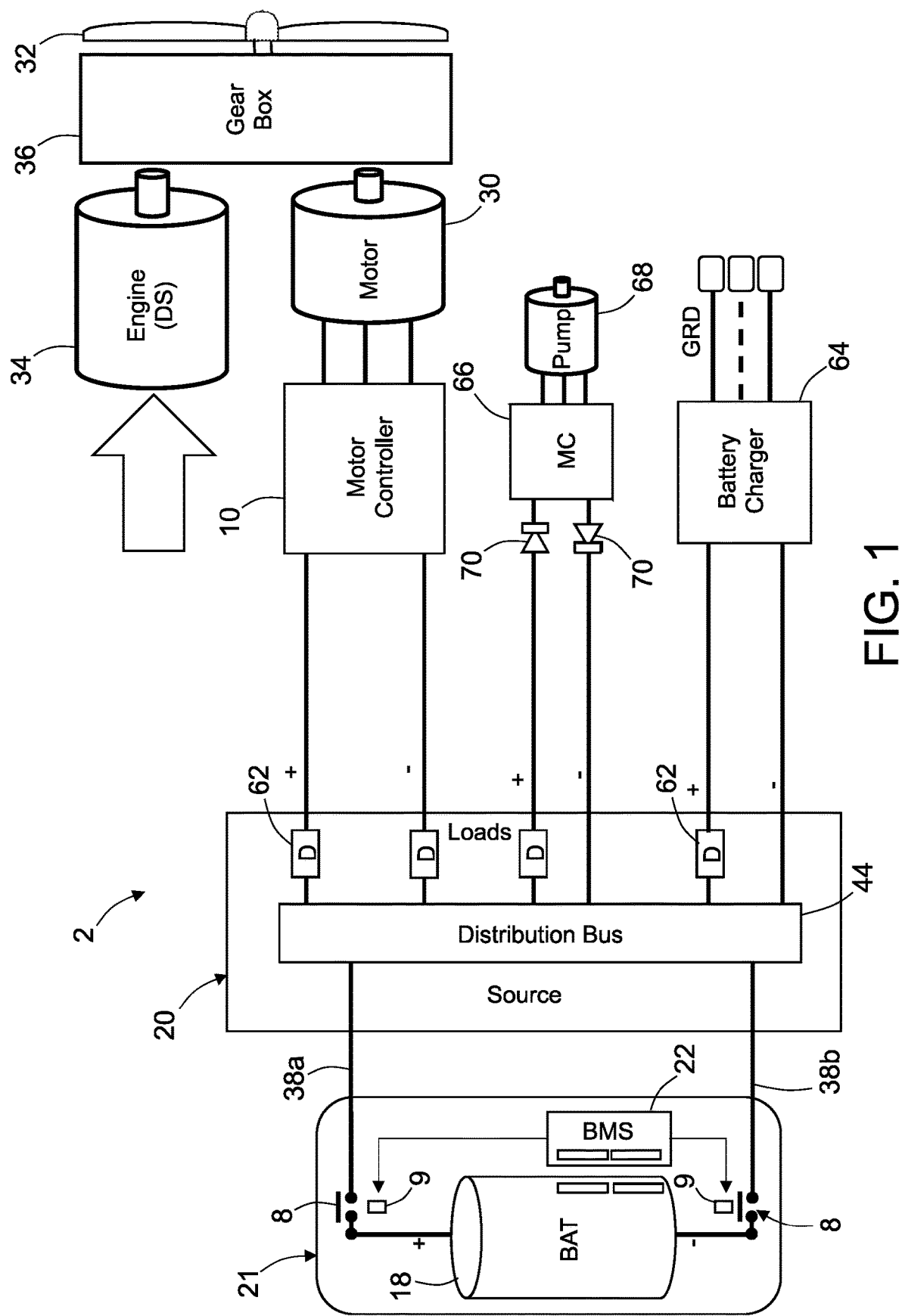
FIG. 1 is a diagram representing a hybrid-electric aircraft propulsion architecture in which a single propulsor is driven via a gear box by either an engine or an electric motor in the alternative.

The innovative technology proposed herein may be added to the hybrid electric aircraft propulsion system 2 shown in FIG. 1, in which a propeller 32 is driven via a gear box 36 by either an engine 34 or an AC motor 30 in the alternative. However, the technology proposed herein is also applicable to all-electric architectures. In either case, the propeller 32 includes a propeller shaft which is mechanically coupled to the output shaft of the AC motor 30 and a plurality of propeller blades.

The hybrid electric aircraft propulsion system 2 depicted in FIG. 1 includes a battery system 21 which is connected to a power distribution panel 20 by means of positive and negative high-voltage busbars 38a and 38b (hereinafter "high-voltage busbars 38a and 38b"). The power distribution panel 20 includes a power distribution bus 44 and a plurality of disconnect devices 62 on the loads side. Various loads are connected to the power distribution bus 44 via the disconnect devices 62. The battery system 21 includes a battery pack 18 and a battery management system 22 (hereinafter "BMS 22"). The battery pack 18 provides power to power distribution bus 44. The battery pack 18 is monitored and operated by the BMS 22. The battery pack 18 is connected to and disconnected from the power distribution bus 44 via a set of contactors 8 on both positive and negative sides or on either one of them that are driven by respective relays 9. Commands to the relays 9 to open or close contactors 8 are issued by the BMS 22.

Power from the battery pack 18 flows into the power distribution bus 44 (which has two rails: positive and negative; for simplicity FIG. depicts both rails as a single element). On the loads side of the power distribution bus 44, there are multiple loads connected via dedicated disconnect devices 62. Typical large loads can be AC motor 30 and pump 68 such as those depicted in FIG. 1. The AC motor 30 and pump 68 are powered by respective motor controllers 10 and 66 that receive DC power from the battery pack 18 via the power distribution bus 44. In hybrid architectures, the AC motor 30 can be coupled to the propeller 32 on an airplane via the gear box 36. At the output shaft of the gear box, a propeller 32 is attached to produce thrust. Smaller utility loads (such as a cooling pump) can use blocking diodes 70 that prevent backflow of power towards the source in the case of regeneration.

The hybrid electric aircraft propulsion system 2 depicted in FIG. 1 further includes a battery charger 64. The battery charger 64 is only used when an airplane is on the ground and the battery pack 18 needs to be charged. The battery charger 64 provides power flow to the battery pack 18 via the power distribution bus 44. Loads are usually OFF when the battery pack 18 is being charged. While all aircraft loads are OFF, the battery charger 64 is connected to the power distribution bus 44 on the loads side and the battery pack 18 is connected to the power distribution bus 44 the source side. The battery pack 18 is ready to be charged whenever a corresponding command is issued by the BMS 22. The BMS is continuously monitoring the battery pack 18 during the charging cycle.

Figure 2:
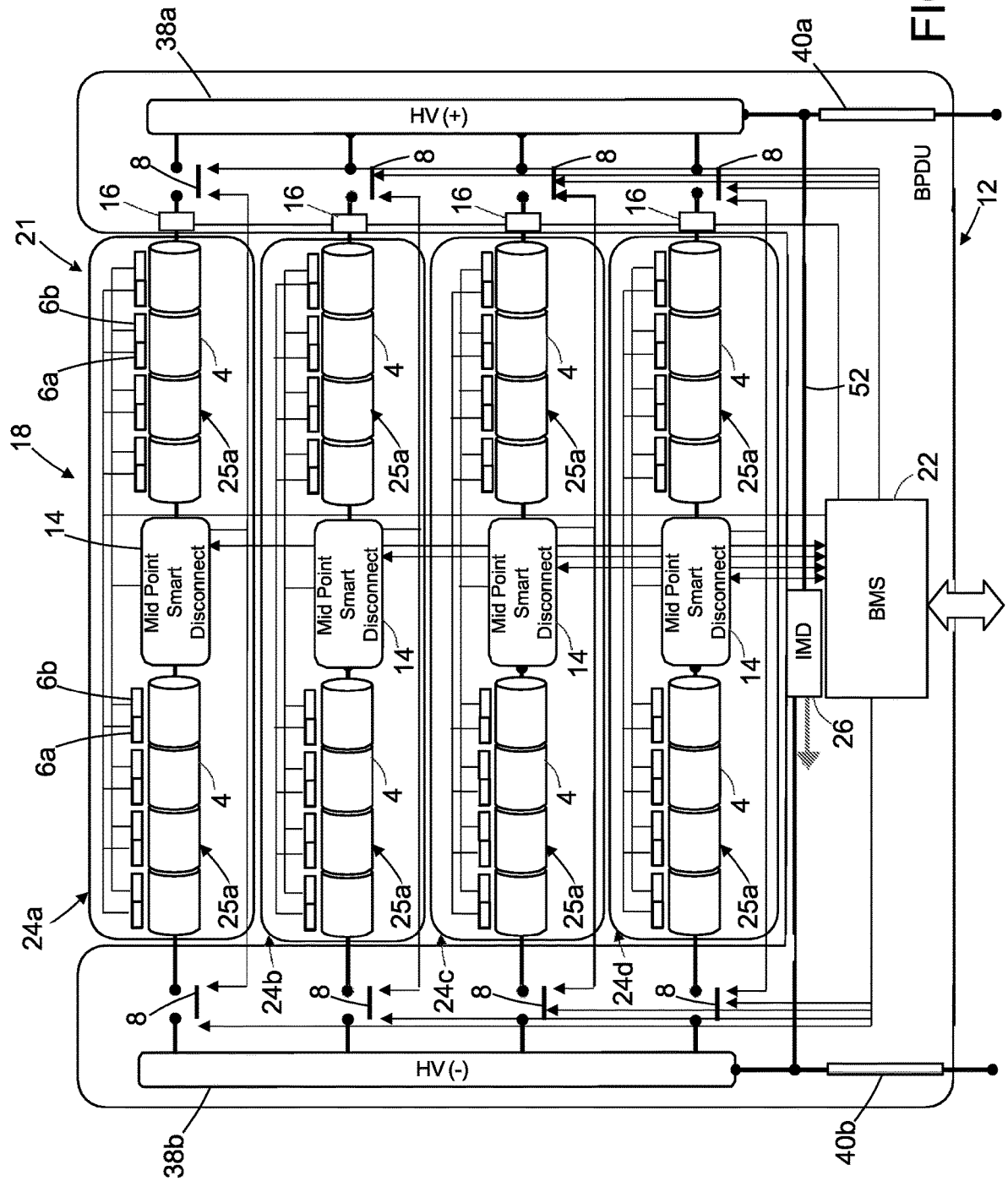
FIG. 2 is a diagram representing a battery multi-string architecture having four battery strings, each string consisting of two sets of four battery modules connected in series via a respective smart mid-point battery disconnect subsystem.

FIG. 2 is a diagram representing a battery multi-string architecture in the form of a battery pack 18 that includes multiple independent battery strings in accordance with one embodiment. The battery pack 18 is connected to the power distribution panel 20 (see FIG. 1) via a battery power distribution unit (BPDU) 12. The BPDU 12 is essentially an enclosure that contains hardware needed for monitoring, commutating, and controlling the DC power output by the battery pack 18.

In accordance with the battery system 21 depicted in FIG. 2, the BPDU 12 includes high-voltage busbars 38*a* and 38*b*. The BPDU 12 further includes a first plurality of string contactors 8 that connect one end of the battery strings 24 to high-voltage busbar 38*a* and a second plurality of string contactors 8 that connect the other end of the battery strings 24 to high-voltage busbar 38*b*. (A contactor is an electrically controlled switch used for switching an electrical power circuit. Contactors are designed to be directly connected to high-current load devices.) The power distribution panel 20 receives DC power signals from the battery strings 24*a*-24*d* via string contactors 8 (when closed) and supplies that DC power to the motor controller 10.

The BPDU 12 further includes a battery management system 22 (hereinafter "BMS 22"). The operation of the battery pack 18 is managed by the BMS 22. Multiple parallel battery strings 24*a*-24*d* may provide redundancy in case of pack internal failure. The BMS 22 may be configured to ensure redundant protections, fail-safe operation, and selective shutdown of battery strings. The BMS 22 may be further configured to provide battery overcharge protection or to forestall other events or combination of events that could lead to battery thermal runaway. More specifically, the switching states of the string contactors 8 are controlled by BMS 22. Essentially, the BMS 22 is the first layer of protection in conjunction with the charger. If either one fails, then the fail-safe device proposed herein disconnects the battery from the rest of the system.

In the example depicted in FIG. 2, battery pack 18 includes four battery strings 24*a*-24*d*. Each battery string consists of two sets of several (four in this embodiment) battery modules 4 connected in series and further connected in series to each other via a respective (smart) mid-point battery disconnect subsystem 14. Each string is built with multiple battery modules 4 connected in series (eight battery modules per string in the example depicted in FIG. 2). Each of the battery strings 24*a*-24*d* further includes respective pluralities of module monitoring units 6*a* and 6*b* (hereinafter "MMUs 6*a* and 6*b*"). A respective pair of MMU 6*a* and 6*b* monitor the state of each battery module. Each of the battery strings 24*a*-24*d* supplies DC power to high-voltage busbars 38*a* and 38*b* via respective string contactors 8. DC power from high-voltage busbars 38*a* and 38*b* is distributed to all HVDC loads.

As seen in FIG. 2, each of battery strings 24*a*-24*d* has a dedicated set of string contactors 8 located in the plus and the minus sides to provide galvanic isolation string by string. The battery strings 24 are connected together in the BPDU 12 via the high-voltage busbars 38*a* and 38*b* when the string contactors 8 are closed. Additionally, a respective dedicated end-point current sensor 16 (e.g., a Hall effect current sensor) is disposed between the contactor 8 connecting each half-string 25*a* to the positive (or negative) high-voltage busbar 38*a*. The BMS 22 is configured (e.g., programmed) to control the different positive and negative string contactors 8 depending on the operating mode (charge, discharge, etc.) and system/pack protection (system short-circuit protection, unbalanced string current, etc.). Each pair of positive and negative string contactors 8 is under dual control by a respective mid-point battery disconnect subsystem 14 and the BMS 22. The BMS 22 is communicatively coupled to all mid-point battery disconnect subsystems 14 for coordination purposes. The BMS 22 is in charge of communicating with the autopilot and others line-replaceable units of the electrical propulsion system.

The BPDU 12 depicted in FIG. 2 also includes an integrated neutral grounding network 52 (connected across battery power output lines 40*a* and 40*b*) and an insulation monitoring device 26 (hereinafter "IMD 26"). The battery pack neutral is connected to mechanical ground though the neutral grounding network 52. The grounding impedance is used to balance the positive and negative bus voltages taking into account the parasitic positive and negative impedances to ground as well as the overall insulating impedance required to guarantee personal safety. For example, a grounding switch can be used to lift the ground connection for sleep mode. The IMD 26 dynamically and actively monitors resistance to ground.

Short circuits in internal cells can cause batteries to experience thermal runaway, which can cause the batteries to fail. Typically, anode and cathode portions of a cell are separated by an insulative barrier. However, insulative barriers can deteriorate such that a short circuit is created between the cathode and anode portions through the barrier. This internal short circuit reduces the internal resistance of the battery, thereby increasing the likelihood of overcharging or over-discharging the cell, which in turn increases the cell temperature and can eventually lead to thermal runaway.

In an alternative scenario, the battery pack 18 depicted in FIG. 1 may receive power from a connected load during a discharge operation (the battery charger 64 is OFF). For example, the AC motor 30 and the motor controller 10 may regenerate DC power back to the power distribution bus 44 during normal motor deceleration, braking phases, or transient operation. Additionally, specific motor/motor controller failure conditions can also create a scenario with significant regeneration. DC regenerated power will need to be absorbed by the battery source (or by other loads that are connected to the same distribution bus). The loads that are connected via the blocking diodes 70 do not regenerate back to the system. In normal operation conditions, the motor and motor controller are controlling the amount of energy regenerated to the system and the battery pack 18 taking into account the maximum system voltage/current allowable. In case of a failure condition, power can be regenerated in an uncontrolled manner and potentially damage the battery pack 18 by excessive voltage or current. The MMUs 6*a* and 6*b* (see FIGS. 6*a* and 6*b*) form a first protection layer internal to the battery system 21 to isolate the battery pack 18 when power is being regenerated in an uncontrolled manner.

Figure 3:
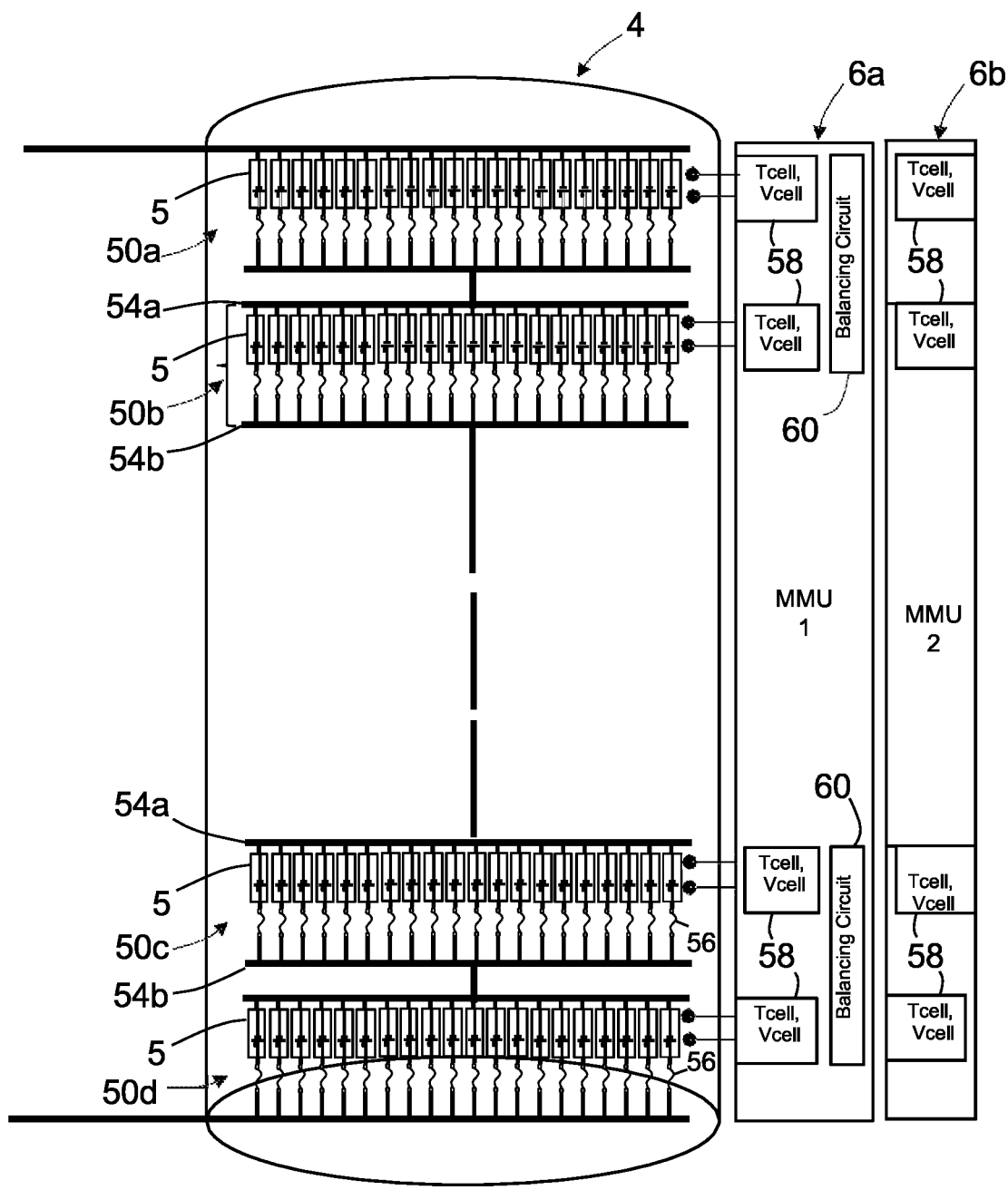
FIG. 3 is a diagram representing a single battery module and associated battery module monitoring units connected and configured to monitor individual cell voltages inside the battery module.

FIG. 3 is a diagram representing a single battery module 4 and associated MMUs 6*a* and 6*b* in accordance with one proposed implementation. Each battery module 4 is a parallel/series arrangement of individual cells 5. In the example depicted in FIG. 3, the battery module 4 includes four rows of cells 5, each row including twenty cells connected in parallel across a pair of cell busbars 54*a* and 54*b*. Each parallel cell arrangement is considered to be a virtual cell (or brick). The four virtual cells 50*a*-50*d* are connected in series. The cell arrangement is done using a respective fusible link 56 in series with each individual cell 5 to protect against cell failure. The elementary module configuration is selected taking into account tradeoffs of safe voltage, manageable weight, volume, and failure containment.

Each battery module 4 is monitored by two independent dissimilar module monitoring units 6a and 6b (labeled MMU1 and MMU2 in FIG. 3). Each module monitoring unit includes sensors 58 for independently measuring each virtual cell voltage and each individual cell temperature. The module monitoring units 6a also includes balancing circuits 60. The balancing circuits 60 perform a passive (or active) balancing function that is activated and controlled by the associated mid-point battery disconnect subsystem 14. Module monitoring unit 6a communicates sensor data representing virtual cell voltage and individual cell temperature to the associated mid-point battery disconnect subsystem 14. In the charge mode, the smart mid-point battery disconnect subsystem 14 sends commands to the balancing circuits 60 to guarantee proper balancing from virtual cell to virtual cell. Module monitoring unit 6b communicates sensor data representing virtual cell voltage and individual cell temperature to the BMS 22. Additionally, module monitoring unit 6b can provide an aggregated flag for cell voltage and cell temperature out of bounds.

When the battery system 21 is operating, the MMUs 6a and 6b monitor individual cell voltages and communicate to the BMS 22 and mid-point battery disconnect subsystem 14. The BMS 22 and mid-point battery disconnect subsystem 14 also receive readouts from Hall Effect current sensors (shown in FIG. 2) to monitor overcurrent conditions. The BMS 22 and mid-point battery disconnect subsystem 14 will detect if the voltage of one or more cells exceeds the safety margin, thereby detecting an overcharge condition. In that case, BMS 22 and mid-point battery disconnect subsystem 14 both issue commands to open the contactors 8 to isolate the battery pack 18 from potential additional overcharge. Additionally during the charge mode, the BMS 22 is controlling the balancing circuits 60 to equalize charge between cells (see FIG. 3).

The MMUs 6a and 6b monitor cell voltages and temperatures. As mentioned above, if one of the cells is overcharged to a level higher than the safety threshold value voltage, the BMS 22 and mid-point battery disconnect subsystem 14 both issue commands to open the contactors 8 on the positive and negative sides. Fusible links 5 shown in FIG. 3 provide protection against the internal short of a cell. If this event occurs, all other paralleled cells (19 in the example depicted in FIG. 3) feed excessive current into the shorted cell, which excessive current overheats the battery module to the thermal runaway regime. To mitigate this, fusible links 5 of a small cross section are typically connected to the cathode and blow open if current exceeds a certain threshold value. Also, as a consequence, when a short circuit occurs external to the stack of series-connected virtual cells in a battery module 4, all fusible links 5 of one of the virtual cells in the battery module blow open, thereby clearing the fault.

The battery system 21 may consist of lithium-ion batteries. A lithium-ion battery overcharge condition can be created by at least three different types of failure event: (1) battery charger regulation circuit failure resulting in a battery charging voltage higher than the end-of-charge voltage; (2) battery internal failure resulting in fewer cells connected in series and the battery charger operating in its normal end-of-charge voltage band (for example, a short circuit of one battery module cleared by an internal fusible link); and (3) uncontrollable regeneration of power fed back into the battery in the case of failure or malfunction of the motor and/or motor controller (inverter).

For example, in the case of a lithium-ion battery, a battery charger regulation circuit failure may result in a battery charger regulating voltage higher than the end-of-charge voltage (e.g., 900 $V_{DC}$). The MMUs 6a and 6b are supposed to detect this condition by monitoring each individual cell voltage (e.g., MMU1>4.3 $V_{DC}$, MMU2>4.4 $V_{DC}$). Battery internal failure may result in fewer cells connected in series and the battery charger 64 operating in its normal end-of-charge voltage band (e.g., a short circuit of one battery module cleared by internal fusible links). The MMUs 6a and 6b are supposed to detect this condition by monitoring each individual cell voltage (MMU1>4.3 $V_{DC}$, MMU2>4.4 $V_{DC}$) and then the battery module is isolated.

An additional layer of protection fully independent and dissimilar from the battery system 21 is required to meet stringent aerospace requirements. This disclosure addresses an additional layer of protection to mitigate overcharging risks caused by uncontrolled regeneration from HVDC loads like the motor/motor controller, battery charger failure, or battery internal failures.

Figure 4:
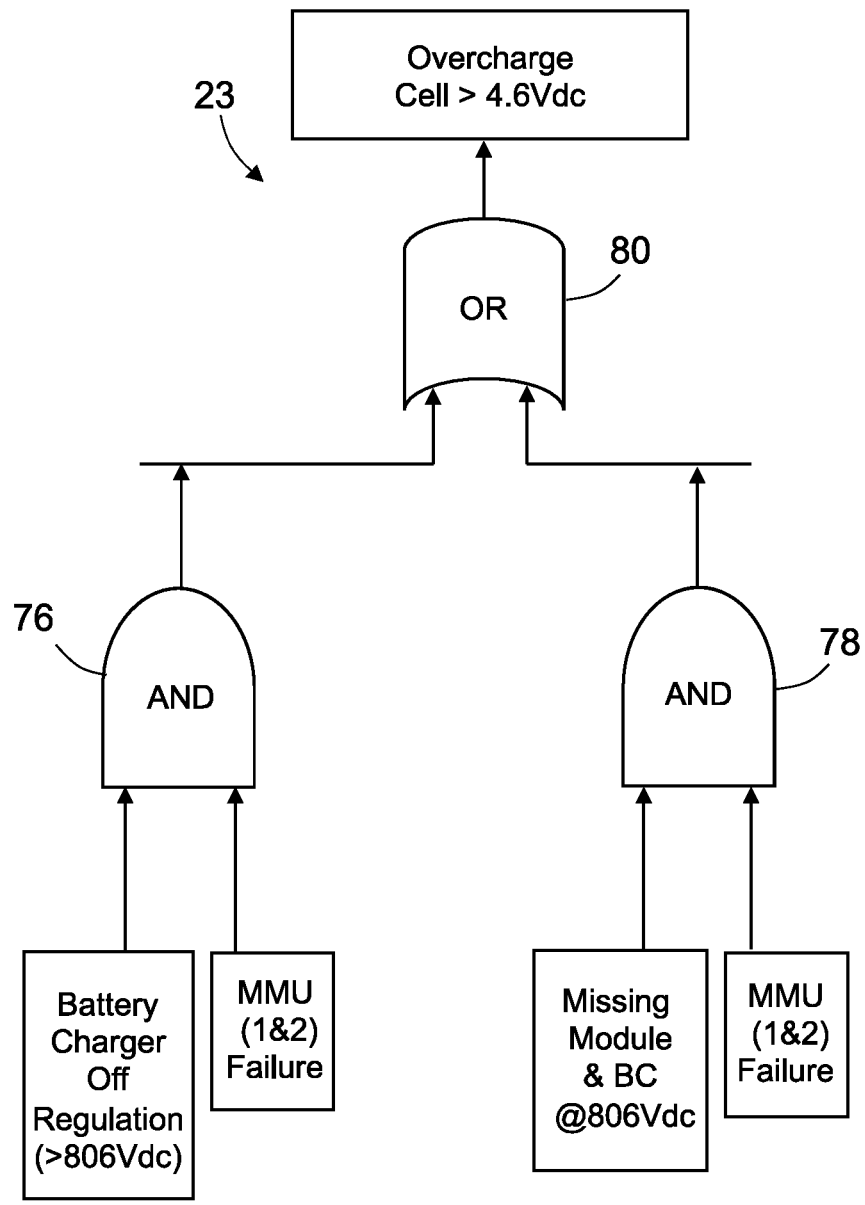
FIG. 4 is a diagram representing a battery cell overcharge fault tree that forms a basis for logic employed in one embodiment of the battery protection system proposed herein.

FIG. 4 is a diagram representing a battery cell overcharge fault tree 23 that forms a basis for logic employed to implement a fail-safe function in a redundant and dissimilar way. The logic is represented by AND gates 76 and 78 and OR gate 80 in FIG. 4. The battery cell overcharge fault tree 23 is based on the assumption that a battery cell (e.g., a lithium-ion cell) is normally to be charged to 4.2 $V_{DC}$ (the absolutely highest voltage that a lithium-ion cell can be exposed to under normal environmental conditions is 4.6 $V_{DC}$). Therefore, a battery module that consists of 192 cells connected in series (at this moment the number of parallel connections does not matter) should be charged to 192*4.2 $V_{DC}$=806 $V_{DC}$ (state of charge (SOC)=100%). If the battery charger goes off regulation (e.g., output voltage exceeds 806 $V_{DC}$) and both MMU1 and MMU2 malfunction (as two independent failures), then the cells become overcharged to voltages higher than 4.6 $V_{DC}$. At this moment, nothing else prevents cells from being overcharged, overheated and eventually entering the thermal runaway regime. Another scenario is when one of the battery modules fails short across its terminals and both MMU1 and MMU2 malfunction again. The charger continues providing 806 $V_{DC}$ but with fewer battery modules in series (e.g., with only seven battery modules instead of eight). In this case cells can also be overcharged and fail.

Figure 5B:
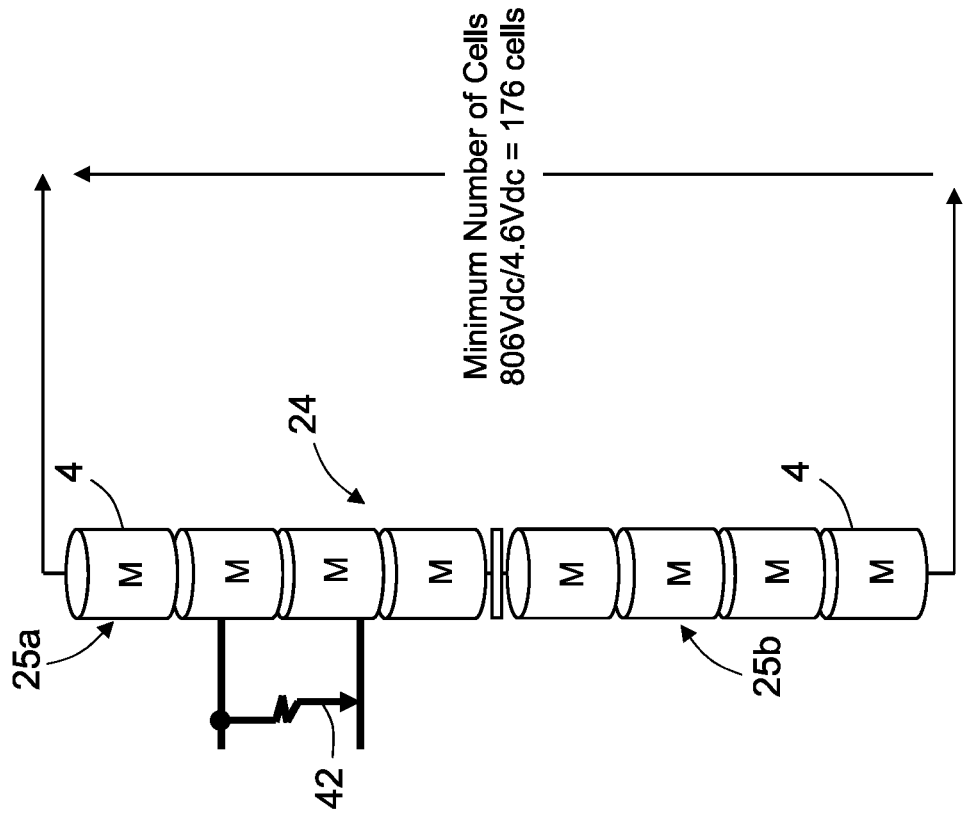
FIG. 5B is a diagram representing a scenario in which one battery module of a battery string having eight modules (each module consisting of multiple cells) has become shorted during battery charging, thereby subjecting the remaining cells in the battery string to a risk of overcharging.
Figure 5A:
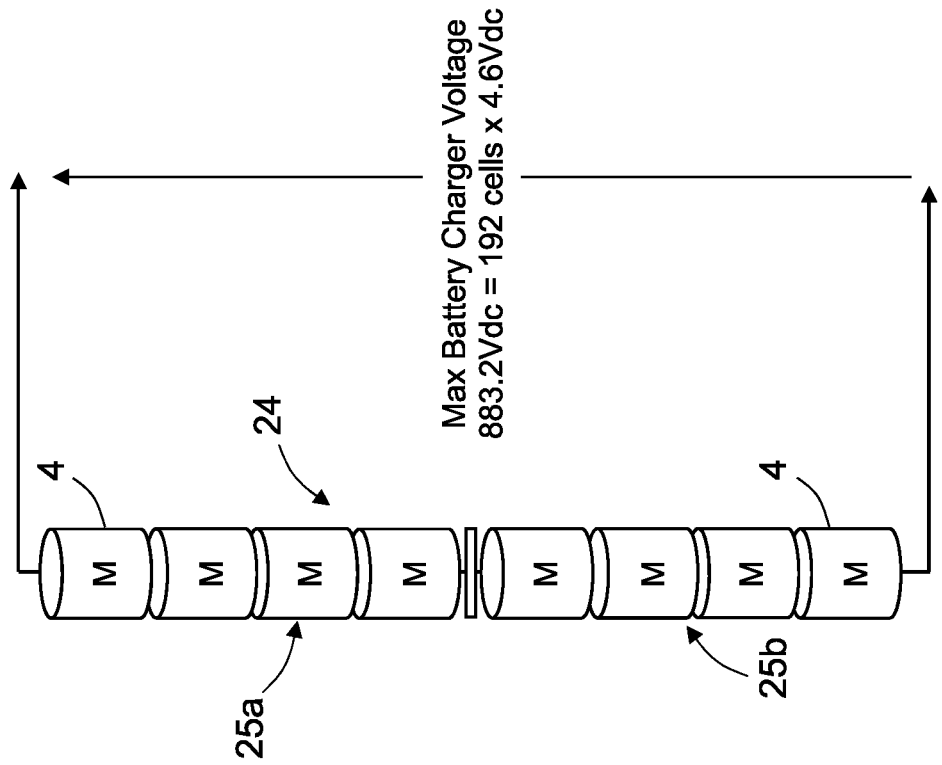
FIG. 5A is a diagram representing a scenario in which all battery modules of a battery string remain electrically connected following failure of the battery charger regulation circuit during battery charging.

FIG. 5A is a diagram representing a scenario in which all battery modules 4 of a battery string 24 remain electrically connected following failure of the battery charger regulation circuit during battery charging. In this example, the maximum battery charger voltage reaches 883.2 $V_{DC}$, in which case the cell voltage equals 4.6 $V_{DC}$. Thus, FIG. 5A depicts a scenario wherein the battery charger goes off regulation and exceeds the absolute safety limit, after which the lithium-ion cells enter the thermal runaway regime. Therefore, if the battery charger uncontrollably provides 192*4.6 $V_{DC}$=883 $V_{DC}$, the cells enter thermal runaway if the MMUs fail.

FIG. 5B is a diagram representing a scenario in which one battery module 4 of a battery string 24 having eight battery modules (each module consisting of multiple cells) has an internal module short circuit 42 during battery charging, thereby subjecting the remaining cells in the battery string 24 to a risk of overcharging. When the battery consists of multiple battery modules connected in series, the size of the battery module may determine design safety margins to address overcharging. The example depicted in FIG. 5B is the following: Under the normal charging conditions, the battery charger provides 806 $V_{DC}$ to charge each of 192 series-connected cells to 4.2 $V_{DC}$. The maximum number of series-connected cells that one battery module should contain in the event of a short circuit is then 192–806/4.6=16 cells/module. If one battery module fails short, then the rest of the cells (176 in number) would be charged to 806/176=4.58 $V_{DC}$ (which is abnormal, but may not cause thermal runaway). In contrast, if only 172 of the 192 cells are operational, the individual cell voltage would be 4.7 $V_{DC}$, which value (in excess of the design limit 4.6 $V_{DC}$) increases the risk of overcharging. Thus, the minimum number of cells needed in this example to avoid overcharging is 176. This solution is intrinsically safe for module short-circuit failure and will not drive to overcharge in case of module short circuit. However, it imposes a design limitation to use smaller battery modules and higher module count per battery, thereby impacting cost, complexity, and reliability.

Typically, there are more than 20 series-connected cells per module (24 in one case, which would result in 806/(192–24)=4.8 $V_{DC}$ per cell). Scaling the number of cells down to 16 would increase the number of series-connected battery modules from 8 to 12. This would result in significantly higher cost for the battery system and reduced volumetric and specific energy and therefore reduced efficiency of the system. The technology proposed herein provides a protection solution to address module failure when battery modules have a higher number of series-connected cells.

Figure 6:
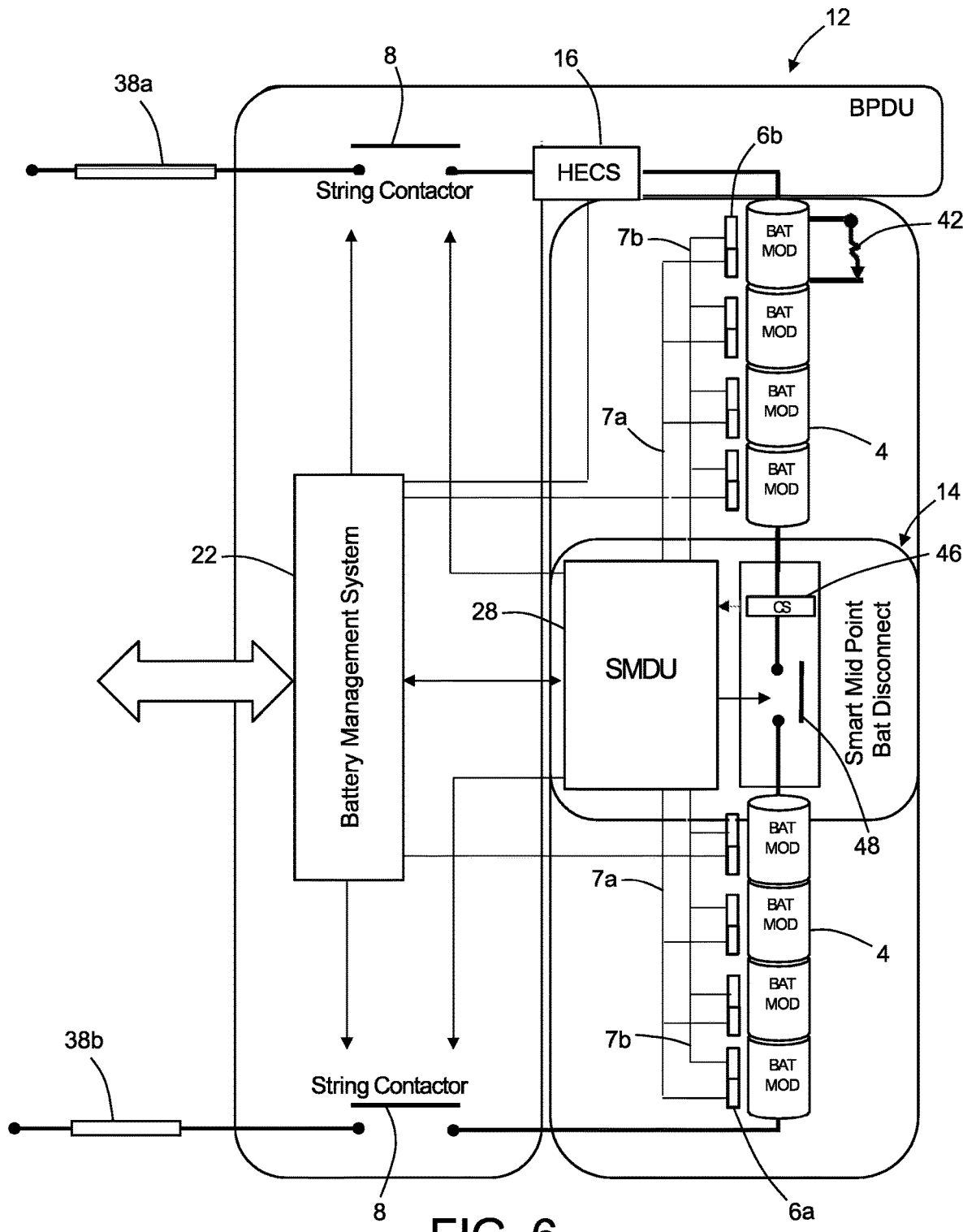
FIG. 6 is a diagram representing a portion of the system depicted in FIG. 2 and identifying components of a typical mid-point battery disconnect subsystem. The diagram includes symbology indicating a scenario in which a single battery module or portion thereof has been lost due to a short circuit internal to the battery module.

FIG. 6 is a diagram representing a portion of the system depicted in FIG. 2 and including internal components of a mid-point battery disconnect subsystem 14 in accordance with one proposed implementation. The battery string 24 is shown in a state wherein a single battery module or part of the module is lost due to an internal module short circuit 42. The mid-point battery disconnect subsystem 14 includes a smart mid-point disconnect unit 28 (hereinafter "SMDU 28") and a mid-point disconnect contactor 48. Each battery string 24 has a respective dedicated SMDU 28. The SMDU 28 includes a processor configured to control the state of the mid-point disconnect contactor 48. The SMDU 28 is communicatively coupled to the BMS 22. The mid-point battery disconnect subsystem 14 further includes a mid-point current sensor 46 which outputs an electrical signal to SMDU 28 representing the current flowing through mid-point battery disconnect subsystem 14 when the mid-point current sensor 46 is closed. The SMDU 28 also receives electrical signals representing the individual cell temperatures and virtual cell voltages from the module monitoring units 6a and 6b via an MMU1/SMDU data bus 7a and an MMU2/BMS data bus 7b. The BMS 22 and the SMDU 28 are configured to independently control the states of the string contactors 8.

The purpose of SMDU 28 is to ensure autonomous safe operation of each battery string 24. The SMDU 28 includes a smart controller/disconnect system for implementing battery and electrical protection/isolation of the battery string 24 in case of failure. The mid-point battery disconnect subsystem 14 further includes a mid-point current sensor 46 that outputs an electrical signal to SMDU 28 representing the current flowing through the first and second half-strings 25a and 25b of series-connected battery modules 4 which make up the battery string 24. The mid-point battery disconnect subsystem 14 further includes a mid-point disconnect contactor 48 disposed between the mid-point current sensor 46 and half-string 25b. In accordance with the embodiment depicted in FIG. 5, the SMDU 28 is configured to perform a battery string protection function that opens mid-point disconnect contactor 48 in case of failure when indicated by the current flowing through mid-point current sensor 46.

The SMDU 28 is further configured to communicate with each module monitoring unit 6a. Each module monitoring unit 6a reports to its respective SMDU its key parameters ($T_{cell1}$, $V_{cell1}$, etc.). The SMDU 28 is configured to implement specific battery cell protection functions to ensure the safety of the battery string 24. In accordance with one proposed implementation, the SMDU 28 is configured to take action in response to any of the following conditions: overcharge (e.g., $V_{cell}$>4.2 $V_{DC}$); over-discharge (e.g., $V_{cell}$<2.5 $V_{DC}$); over temperature (e.g., $T_{cell}$>80° C.); high charge rate (e.g., $I_{charge}$>1C rate for 30Q cells or >3C rate for cells with LTO anodes); low temperature (e.g., $T_{cell}$<−20° C.); and virtual cell unbalanced (e.g., $\Delta V_{cell}$>50 mV). In case of battery module string internal failure, SMDU 28 will actuate open the mid-point disconnect contactor 48 and sequentially open the dedicated string contactors 8.

In charge mode, the SMDU 28 is controlling the balancing circuits 60 embedded in module monitoring unit 6a (MMU1) to guarantee proper balancing from virtual cell to virtual cell. For charge or regeneration mode, SMDU/MMU1 battery protection will open a string contactor 8 to stop charging current. Optionally, the battery charger could receive information to zero out charging current regulation or regeneration power. BMPS/MMU2 battery protection at pack level will provide redundancy and dissimilarity from SMDU/MMU1 for battery critical protection (overcharge, over-discharge, over temperature, etc.).

The SMDU 28 is also configured to perform a string electrical protection function. The SMDU 28 is configured to implement specific battery string electrical protection such as: overcurrent protection (trip curves example); string differential current protection; and optional string insulation monitoring protection (employing IMD 26 shown in FIG. 2).

The SMDU 28 is measuring current with its integrated current sensors (e.g., Hall effect or shunt-type current sensors) in series with the mid-point disconnect contactor 48 as seen in FIG. 6. In case of failure, the SMDU 28 will actuate open the mid-point disconnect contactor 48 and isolate the battery string 24. Sequentially after opening of the mid-point disconnect contactor 48, SMDU 28 will open the dedicated string contactor 8 to provide galvanic isolation.

Figure 7:
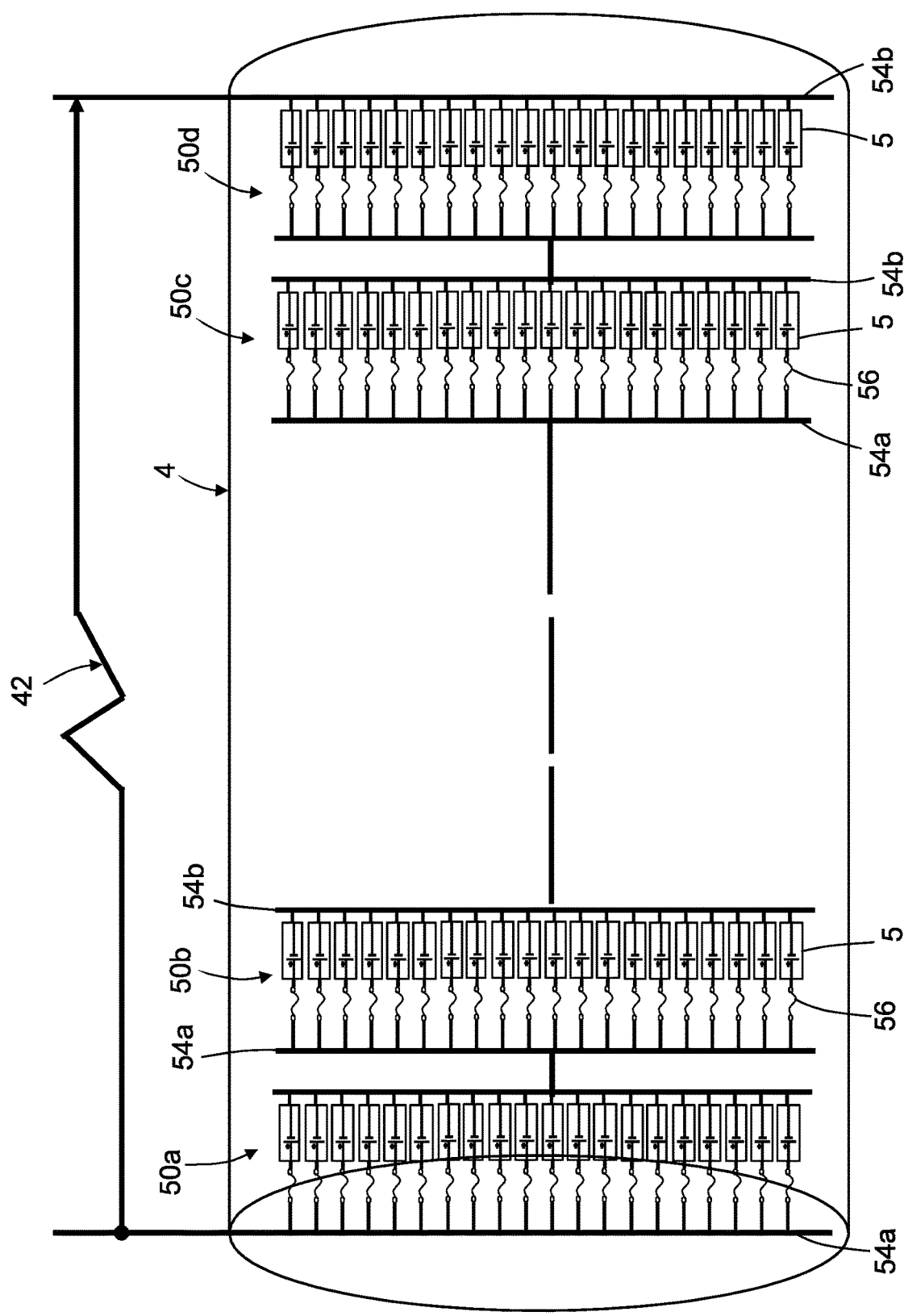
FIG. 7 is a diagram representing internal components of the short-circuited battery module depicted in FIG. 6.

FIG. 7 is a diagram representing internal components of the short-circuited battery module depicted in FIG. 6. In this case, the internal short circuit 42 is between cell busbar 54a of virtual cell 50a and cell busbar 54b of virtual cell 50d. All fusible links of one virtual cell will blow open in response to the short circuit, thereby clearing the fault. (Due to stochastic dispersion of resistivity of individual links, one cannot predict which virtual cell will be the first to have all of its fusible links blow.)

Each battery module 4 includes basic protections to ensure safe standalone operation. In case of individual cell short-circuit failure, the fusible link 56 in series with the failed cell 5 will see the current of all the parallel cells 5 and open due to overcurrent. The failed cell 5 will be isolated and the battery module 4 will remain operational with reduced capability. There is no arcing due to the low voltage across a single fusible link 56 (e.g., <5 $V_{DC}$). In case of a battery module internal short circuit 42 (shown in FIG. 7), the combined fusible links 56 of one virtual cell 50 will open due to the overcurrent and isolate the battery module 4. Thus, the battery module 4 will be open circuit and non-operational. The module design (number of series cell, fusible link sizing, etc.) enables a state wherein if the fusible link 56 is opened, the voltage across the fusible link 56 (at the considered altitude) will be lower than an acceptable threshold value and not create any sustained arcing. For example, there is no arcing due to the low voltage across all fusible links 56 of a virtual cell (e.g., <100 $V_{DC}$). Cell fusible links 56 are a protection feature only for internal battery module failure (cell short circuit or virtual cell short circuit). When installed in a string, the combined or individual fusible links of a virtual cell should not be open for an external short circuit. The opening of a fusible link (particularly for a complete virtual cell) in case of module external fault could create significant continuous arcing with high energy in close proximity to the cell.

FIGS. 6 and 7 illustrate the scenario wherein a single battery module or part of the module is lost due to a battery module internal short circuit 42. If such a fault occurs, a very large current flows in a formed circuit through the location of the fault from the cells connected in parallel (multiple paralleled cells form a virtual cell; multiple series-connected virtual cells form a module). At a certain moment, the fusible links 56 of one of the virtual cells blow, thereby breaking the circuit and causing the short-circuit current to cease. However, the other modules in the battery string 24 continue to supply current to the loads through the location of the fault, bypassing the shorted battery module (see FIG. 7).

During a charging cycle, the current supplied by the battery charger 64 (see FIG. 1) is limited. Therefore, the battery system 21, after clearing a fault across a battery module by opening fusible links 56, remains connected to the battery charger 64 and continues to be charged, which may result in overcharging of the battery as described above (overcharging the remaining seven out of eight battery modules).

The failsafe battery protection scheme proposed herein is based on the concept of providing a capability to disconnect the battery from the charger independent from the ability of the BMS 22 to protect against battery overcharge or abuse while in a charge mode or a discharge mode. An additional fail-safe (last resort) protection layer is provided which: (a) is independent from the BMS 22 and MMUs 6a and 6b (see FIG. 3); (b) uses a dissimilar data processing technique (e.g., if the BMS data is processed using software, then data processing by the fail-safe device is done in an FPGA); (c) is fully separated from the battery system 21; (d) is simple and robust (do not need to use individual cell voltages); (e) protects against overcharging in both the charge and discharge modes; and (f) does not use blocking diodes in the discharge mode (which would create significant losses for a high-voltage power system and additional heat and not allow the normal regeneration/energy recuperation mode).

On the one hand, to detect a scenario in which regulation of the battery charger has failed, the battery charging protection scheme proposed herein measures the string voltage (Vbat) across the end terminals of each battery string and detects when the measured string voltage exceeds a string voltage threshold value indicative of the presence of an abnormality. On the other hand, to detect a scenario in which a battery module has a short-circuit failure, the battery charging protection scheme proposed herein measures the half-string voltages (Vstack(+) and Vstack(−)) across the end terminals of the two half-strings of each battery string and detects when their difference exceeds a half-string voltage difference threshold value indicative of the presence of an abnormality. Optionally, the voltages across individual battery modules may be measured to detect an abnormality during charging.

In accordance with various embodiments, additional redundant battery protection may be provided by simple battery protection hardware (e.g., FPGA or discrete logic) embedded in a power distribution panel or a separate distribution box with dedicated housekeeping power supply using battery voltage to operate. In accordance with one proposed implementation, the fail-safe battery overcharge protection circuit includes a dedicated contactor and a dedicated pyro switch which may be activated in sequence to disconnect the battery from the battery charger. More specifically, if the contactor is inoperative, the pyro switch may be activated in response to further increase in the measured overcharge voltage. An additional shunt can be used to protect against excessive charging current and short-circuit failure.

Figure 8:
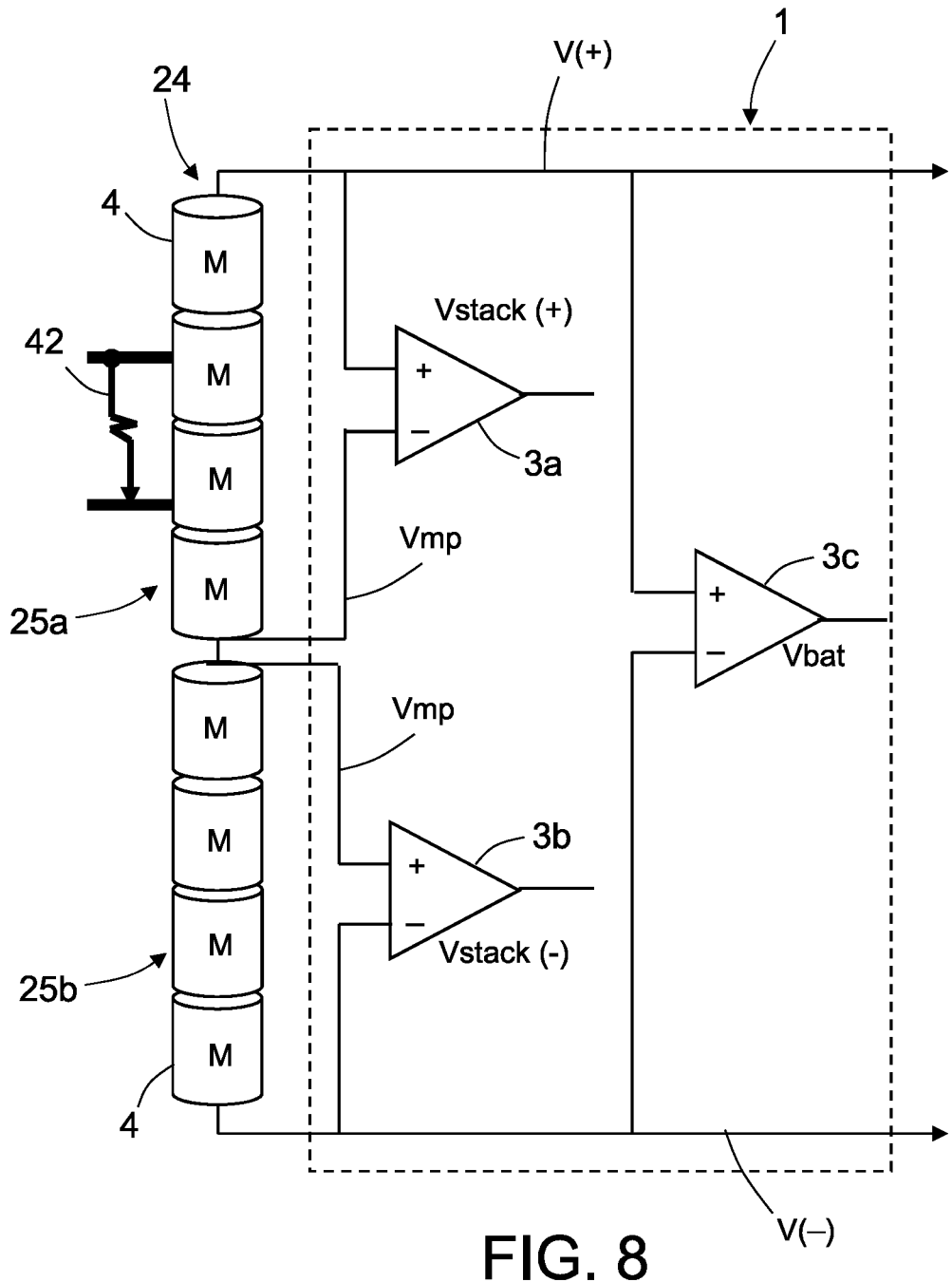
FIG. 8 is a diagram representing a set of voltage transducers arranged to measure full-string and half-string voltages in a battery string having a short-circuited battery module (as depicted in FIG. 5B).

FIG. 8 is a diagram representing a set of voltage transducers 3a-3c arranged to measure full-string and half-string voltages in a battery string 24 having a short circuited 42 (as depicted in FIG. 5B). FIG. 8 shows a setup to measure and report voltages to be used to conclude that an abnormality is present (e.g., a battery module off due to the short circuit 42). Voltage transducer 3a measures the half-string voltage Vstack(+) from the V(+) rail to the mid-point of the battery string 24. The half-string voltage Vstack(+) across the terminals of half-string 25a equals the difference between V(+) and the midpoint voltage Vmp. Voltage transducer 3b measures the half-string voltage Vstack(−) from the V(−) rail to the mid-point of the battery string 24 corresponding to half-string 25b. The half-string voltage Vstack(−) across the terminals of half-string 25b equals the difference between V(−) and the midpoint voltage Vmp. Voltage transducer 3c measures the full-string voltage Vbat from the V(+) rail to the V(−) rail. The full-string voltage Vbat across the terminals of battery string 24 equals the difference between V(+) and V(−). In accordance with alternative embodiments, any combination of two voltage transducers enables the sought functionality via implementing a mathematical operation (Vstack(+)+Vstack(−)=Vbat or Vbat−Vstack(+)=Vstack(−) or Vbat−Vstack(−)=Vstack(+)), but in these cases the calculated voltages are not independent.

The measurement Vbat is compared to the set level of voltage for charging. If during the charging cycle, the voltage detected by the sensor is greater than Vbat+Vacc (nominal voltage) and Vbat−Vacc+dV (absolutely highest voltage not allowing thermal runaway, where Vacc is the accuracy of the sensor, e.g. 2.5% and dV is the margin above the nominal voltage that the battery can withstand, e.g. for a single cell with the nominal voltage 4.2 $V_{DC}$, the safety margin is 0.4 $V_{DC}$, making the absolute highest voltage possible 4.6 $V_{DC}$ minus Vacc), then this condition is identified by the BMS 22 (see FIG. 2) as the overcharge. For example, if the accuracy of a 1000 $V_{DC}$-rated sensor is ±0.5% (±5 $V_{DC}$), then the measured nominal voltage for an entire battery string consisting of 192 cells should not exceed (192×4.2)+5=806.54+5=811.4 $V_{DC}$ and the absolute highest voltage will then be Vbat=(192×4.6 $V_{DC}$)−5 $V_{DC}$=878.2 $V_{DC}$. One may conclude that the safety threshold value dV is determined then as dV=(Vmax_cell−Vnom_cell)×#of_cells=(4.6−4.2)×192=76.8 $V_{DC}$.

Assume that the voltage transducers measuring half-string voltages are rated to 500 V and also have accuracy of ±0.5% (±2.5 $V_{DC}$). Then, for a half-string of 192 battery cells, the nominal voltage is 192/2×4.2 $V_{DC}$±2.5 $V_{DC}$=403.2 $V_{DC}$±2.5 $V_{DC}$. As soon one of the battery modules is missing, the readouts of Vstack(+) and Vstack(−) differ by more than the sum of 2×(±2.5 $V_{DC}$)=5 $V_{DC}$ due to accuracy, and the threshold value dV is set to, e.g., 15 V. For example, the maximum normal difference in this case would be 20 $V_{DC}$, such as if Vstack(+) and Vstack(−) were to read 413.2 $V_{DC}$ and 393.2 $V_{DC}$, respectively. Realistically, these numbers should reflect maximum numbers of cells per single battery module. For example, as previously described with reference to FIG. 5B, if the total number of cells in a battery string is 192, then a determination may be made that the maximum number of cells per module should be 16. Therefore, when one battery module is missed, the cells (at 100% SOC) are exposed to 806.2/176=4.58 $V_{DC}$ per cell and are within the safety limit. The unbalanced voltage is then 16×4.2 $V_{DC}$=67.2 $V_{DC}$ (greater than the 20-V threshold value). In practice, however original equipment manufacturers try to maximize the number of cells per battery module and implementation of redundant protection which is dissimilar to the BMS protection is imperative.

The voltage transducer readouts are reported to the fail-safe device (in addition to the BMS) as three (or a minimum of two) independent measurements. The fail-safe device includes a processor that is configured to check for the voltage measurement Vbat for absolute overvoltage and for unbalancing and issue commands to clear a faulted state as described below with reference to FIG. 11. An alternative solution is to measure the voltage of each battery module (eight modules, for example) and apply similar unbalanced logic protection, but in this case the complexity and cost go up and the system reliability decreases.

Figure 9:
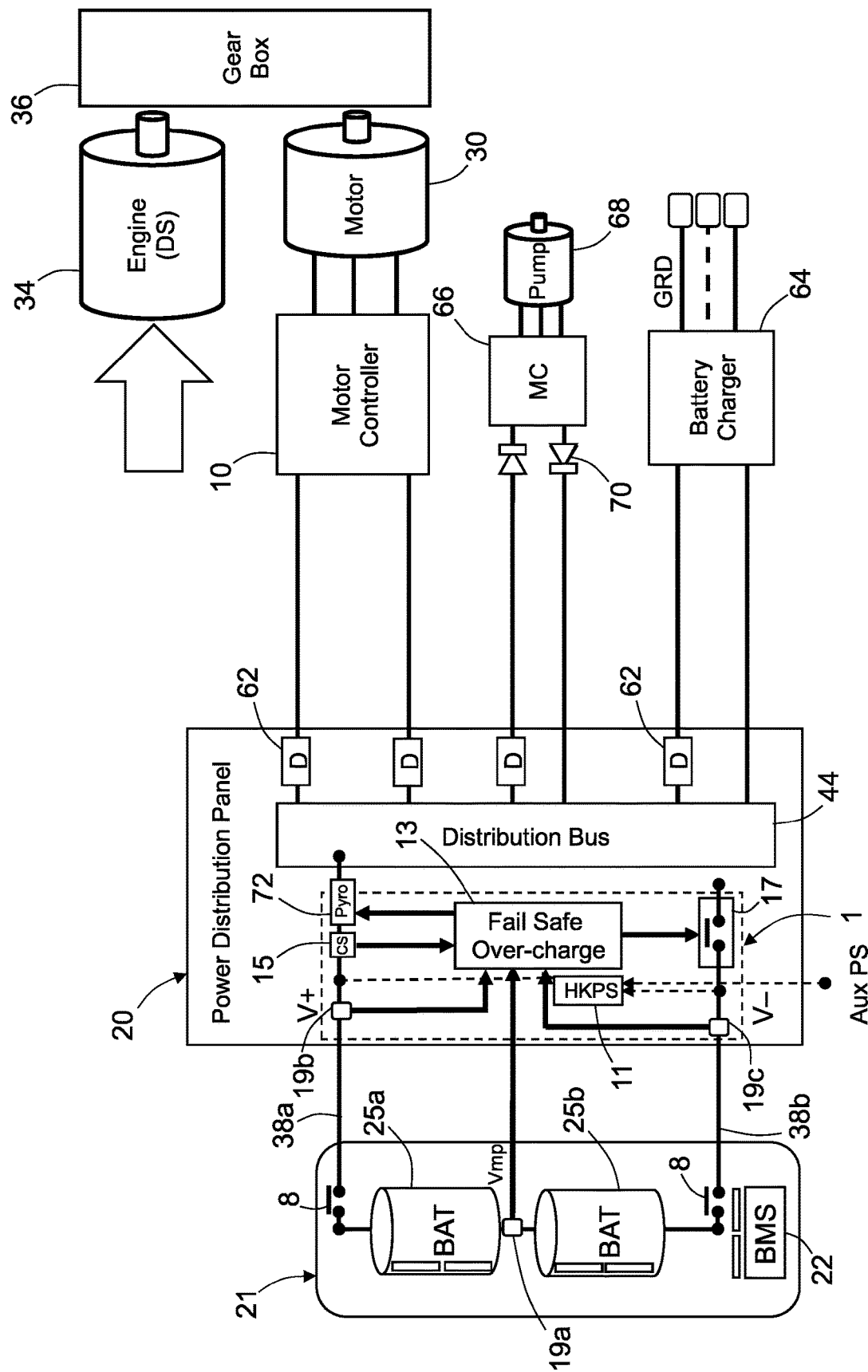
FIG. 9 is a diagram representing a hybrid-electric aircraft propulsion architecture in which the power distribution panel includes a fail-safe device to provide fail-safe protection against battery overcharging independent of the battery management system.

FIG. 9 is a diagram representing a hybrid-electric aircraft propulsion architecture in which the power distribution panel 20 includes fail-safe battery overcharge protection device 1 to provide fail-safe protection against battery overcharging independent of the BMS 22. The fail-safe battery overcharge protection device 1 is independent from the rest of the system as follows: (a) fail-safe battery overcharge protection device 1 derives its own power from the battery pack 18 using a dedicated housekeeping power supply 11; (b) optionally, the fail-safe battery overcharge protection device 1 may receive power from an auxiliary power supply ("Aux PS" in FIG. 8) onboard the aircraft; and (c) the fail-safe battery overcharge protection device 1 uses its own dedicated sensors for monitoring, including current sensor 15 seen in FIG. 9 and voltage transducers 3a-3c seen in FIG. 8.

The contacts 19a-19c in FIG. 9 indicate tap points where the voltage Vmp at the mid-point, voltage V(+) of positive high-voltage busbar 38a, and voltage V(−) of negative high-voltage busbar 38b are measured relative to a reference voltage. The contacts 19a-19c are respectively electrically connected to one input of the voltage transducers 3a-3c shown in FIG. 8. The fail-safe battery overcharge protection device 1 includes a failsafe overcharge processor 13 which processes the outputs from the voltage transducers 3a-3c. The difference in the measured voltages Vmp and V(+) at contacts 19a and 19b is the half-string voltage Vstack(+) across the end terminals of the half-string 25a. The difference in the measured voltages Vmp and V(−) at contacts 19a and 19c is the half-string voltage Vstack(−) across the end terminals of the half-string 25b. The difference in the measured voltages V(+) and V(−) at contacts 19b and 19c is the full-string voltage Vbat across the end terminals of battery string 24. In an alternative implementation, these voltages may be referenced to ground if the battery string 24 has a high-impedance center tap. Optionally, the fail-safe battery overcharge protection device 1 and BMS 22 may both independently measure the same full-string and half-string voltages. In addition, the measurements taken by the BMS 22 can be compared to the measurements taken by the fail-safe battery overcharge protection device 1 for health monitoring reasons.

The failsafe overcharge processor 13 receives power from the housekeeping power supply 11 and receives three (or two as a minimum) signals from the voltage transducers 3a-3c. The failsafe overcharge processor 13 then compares the Vbat to a pre-set threshold value calculated as explained below with reference to FIG. 11. If Vbat exceeds the threshold value, the failsafe overcharge processor 13 identifies over-voltage (from the battery charger 64 or from AC motor 30 in the regeneration mode) and commands a contactor 17 (shown on the negative high-voltage busbar 38b) to open. This operation is resettable, i.e., the contactor 17 can be commanded to re-close by pilot over-ride. Additionally, as a dissimilar means of protection, a pyro switch 72 can also be commanded to open if the contactor 17 is failed welded or if the contactor 17 is not capable to break the current. The pyro switch 72 includes a pyro fuse disposed along the positive high-voltage busbar 38a. A pyro fuse is a type of fuse for high voltage that uses explosive rather than melting metal bar to prevent arcing by disconnecting contacts faster.

In case of failure of the housekeeping power supply 11, the contactor 17 of the fail-safe battery overcharge protection device 1 will automatically release to an open state, thereby isolating the battery pack 18 to be in a safe condition. Also, the failsafe overcharge processor 13 receives Vstack(+) and Vstack(−) readouts and compares these values to determine the health of two half-strings, e.g., to determine whether a battery module is inoperative or not.

The fail-safe battery overcharge protection device 1 can be implemented in a separate enclosure. Preferably, the fail-safe battery overcharge protection device 1 is embedded in an existing aircraft equipment such as the power distribution panel 20 that may also contain the distribution bus 44 and disconnect devices 62 on the loads side. Also, three or two voltage transducers can also be installed inside the power distribution panel 20, thereby ensuring absolute segregation of the fail-safe battery overcharge protection device 1 from the battery system 21.

Figure 10:
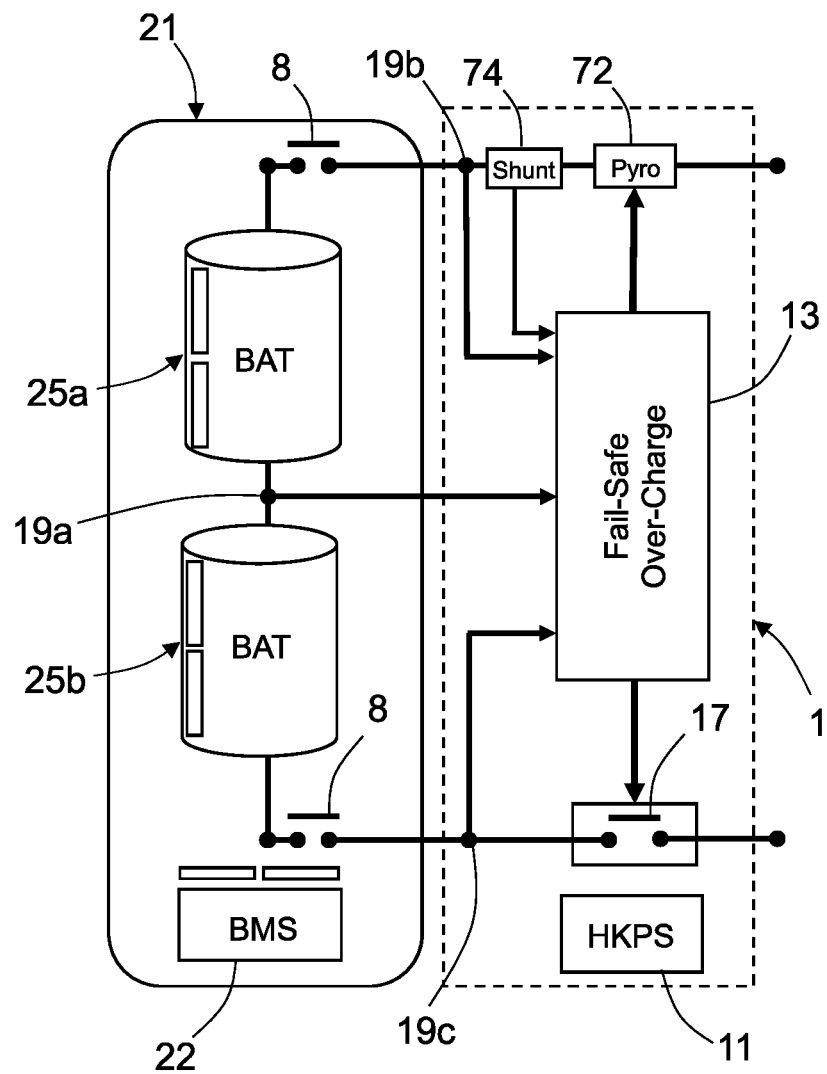
FIG. 10 is a diagram identifying components of a battery system including two battery strings and a battery management system connected to a fail-safe battery overcharge protection circuit in accordance with one embodiment.

FIG. 10 is a diagram identifying components of a battery system including two battery strings 25a and 25b and a BMS 22 connected to a fail-safe battery overcharge protection device 1 in accordance with an alternative embodiment. In this example, the failsafe overcharge processor 13 receives a current measurement from a shunt-type current sensor which is connected to the positive high-voltage busbar 38a.

Figure 11:
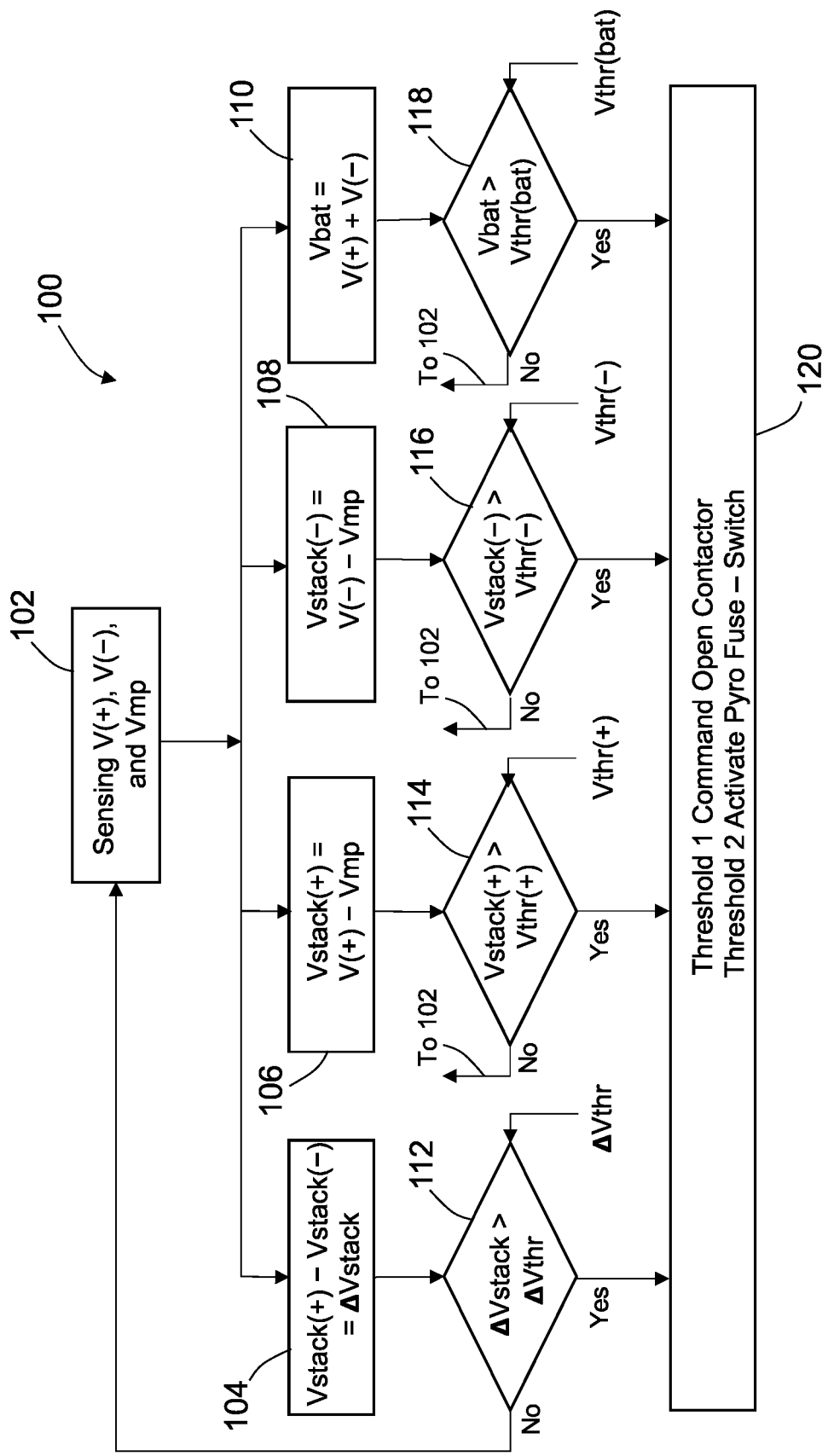
FIG. 11 is a flowchart identifying steps of an algorithm for monitoring battery string and half-string voltages to protect against overcharging in accordance with one proposed implementation.

FIG. 11 is a flowchart identifying steps of an algorithm 100 for monitoring full-string and half-string voltages to protect against overcharging in accordance with one proposed implementation. More specifically, algorithm 100 activates protection based on the readouts of the voltage transducers and pre-set threshold values. The algorithm 100 is performed while the battery string 24 is being charged. For example, any disconnect devices (including contactor 17 and pyro switch 72) disposed between battery string 24 and battery charger 64 shown in FIG. 9 are closed during charging. During charging, the voltages V(+), V(−), and Vmp are sensed (step 102). Based on these sensed voltages, the full-string and half-string voltages are measured. More specifically, a first half-string voltage Vstack(+)=V(+)−Vmp is measured across the half-string 25a (step 106) and a second half-string voltage Vstack(−)=V(−)−Vmp is measured across the half-string 25b (step 108). In addition, the full-string voltage Vbat=V(+)+V(−) is measured across the battery string 24 (step 110). Lastly, a difference ΔVstack between the measured first and second half-string voltages Vstack(+) and Vstack(−) is calculated (step 104).

Still referring to FIG. 11, the difference ΔVstack is compared to a difference threshold value ΔVthr (step 112). On the one hand, if a determination is made in step 112 that the difference ΔVstack is not greater than the difference threshold value ΔVthr, then the process returns to step 102. On the other hand, if a determination is made in step 112 that the difference ΔVstack is greater than the difference threshold value ΔVthr, then the failsafe overcharge processor 13 (see FIG. 9) issues a command to open the contactor 17 (step 120).

In addition, the failsafe overcharge processor 13 is configured (in hardware or software) to compare a magnitude of the measured full-string voltage Vbat to a full-string voltage threshold value Vthr(bat) (step 118). On the one hand, if a determination is made in step 118 that the measured full-string voltage Vbat is not greater than the full-string voltage threshold value Vthr(bat), then the process returns to step 102. On the other hand, if a determination is made in step 118 that the measured full-string voltage Vbat is greater than the full-string voltage threshold value Vthr(bat), then the failsafe overcharge processor 13 issues a command to open the contactor 17 (step 120).

In addition, the failsafe overcharge processor 13 is configured to compare a magnitude of the measured half-string voltage Vstack(+) to a half-string voltage threshold value Vthr(+) (step 114) and also compare a magnitude of the measured half-string voltage Vstack(−) to a half-string voltage threshold value Vthr(−) (step 116). If a determination is made in step 114 that the measured half-string voltage Vstack(+) is not greater than the half-string voltage threshold value Vthr(+), then the process returns to step 102. Similarly, if a determination is made in step 116 that measured half-string voltage Vstack(−) is not greater than half-string voltage threshold value Vthr(−), then the process returns to step 102. In contrast, if a determination is made in step 114 that the measured half-string voltage Vstack(+) is greater than the half-string voltage threshold value Vthr(+) and if a determination is made in step 116 that the measured half-string voltage Vstack(−) is greater than the half-string voltage threshold value Vthr(−), then the failsafe overcharge processor 13 confirms that a sensor has not failed by comparing ΔV(+)=Vstack(+)−Vthr(+) to ΔV(−)=Vstack(−)−Vthr(−). If ΔV(+)=ΔV(−), then the failsafe overcharge processor 13 issues a command to open the contactor 17 (step 120).

The difference threshold value ΔVthr is calculated so that the difference ΔVstack will be greater than the difference threshold value ΔVthr when the state of the system is that one battery module is not operating. The contactor 17 then is commanded to open when a first threshold value is reached. If, in this implementation, the contactor 17 is welded and the voltage continues to increase, a second threshold value can be used to activate the pyro switch 72. This coordination may also take into the account that if housekeeping power supply 11 loses power, then the pyro switch 72 cannot be commanded to break a circuit and at the same time the contactor (normally open) automatically opens due to loss of holding low voltage.

The loop including steps 110 and 118 monitors Vbat (if three voltage transducers are used) or calculates Vstack(+)+Vstack(−) (if two voltage transducers are used). The measured full-string voltage Vbat is compared to the full-string voltage threshold value Vthr(bat), which may be dynamically adjusted by the failsafe overcharge processor 13 using a programmed lookup table of the battery voltage as a function of energy consumed. If the full-string voltage threshold value Vthr(bat) is exceeded, the failsafe overcharge processor 13 concludes that the battery charger 56 has entered an unregulated regime or the feedback voltage produced during regeneration is too high and the battery pack 18 is disconnected by opening contactor 17 or pyro switch 72.

Figure 12:
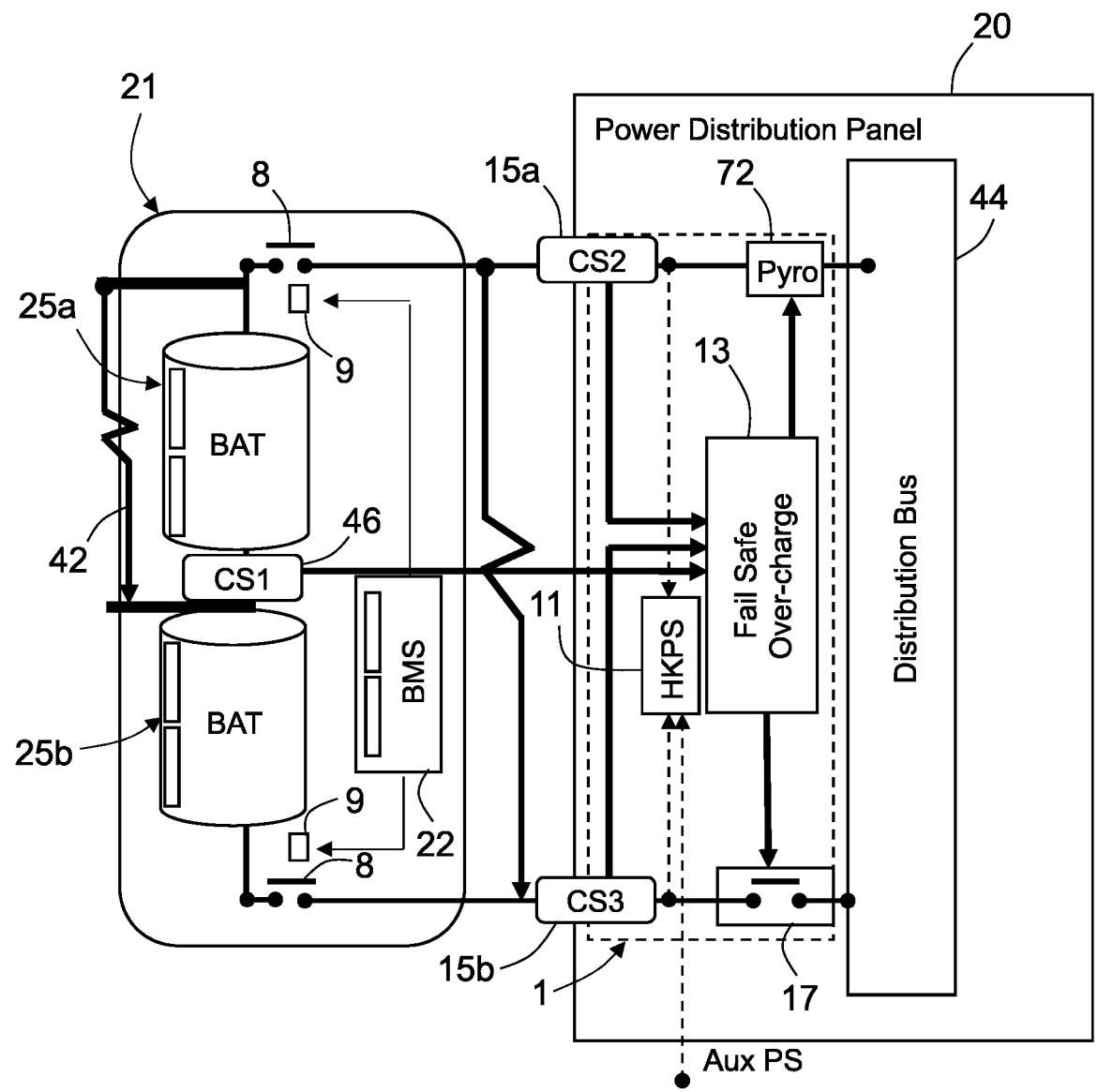
FIG. 12 is a diagram identifying components of a battery system including two battery strings and a battery management system connected to a fail-safe battery overcharge protection circuit in accordance with another embodiment. The diagram includes symbology indicating a scenario in which a battery half-string has been lost due to a short circuit.

The flowchart presented in FIG. 11 shows a voltage-based logic employed by the failsafe overcharge processor 13 to determine the appropriate battery protection response. In an alternative implementation, a current-based logic may be employed. FIG. 12 is a diagram identifying components of a battery system 21 connected to a fail-safe battery overcharge protection circuit 1 configured to process data from three current sensors: current sensor 46, which is connected to the mid-point between half-strings 25a and 25b, and current sensors 15a and 15b embedded in or attached to the power distribution panel 20. FIG. 12 depicts a scenario in which battery half-string 25a has been lost due to a short circuit 42.

As a dissimilar means of protection, the pyro switch 72 can also be commanded to open if the contactor 17 becomes welded or if a current exceeds the capability of the contactor to break a current. The latter circumstance is especially important if the fail-safe device detects an overcurrent condition (by analyzing the readout of current sensor 15a and/or current sensor 15b: if a short circuit occurs between the fail-safe device and the battery system 21, then current sensors 15a and 15b report a current significantly larger than the charging current (the first current threshold) during the charging cycle and the failsafe overcharge processor 13 commands the pyro switch 72 and contactor 17 to open. Another charging scenario is when a short circuit occurs inside the battery (between the positive and mid-tap or negative and mid-tap), then the current sensor 46 reports a very high current (second current threshold 2), much higher than normal charging current detected by all of current sensors 15a, 15b, and 46 as the same value. This constitutes differential protection that results in the BMS 22 sending a command to shut down the battery and the BMS 22 communicates this abnormal scenario to the failsafe overcharge processor 13, which then activates disconnecting the battery charger 64 by opening the contactor 17 and pyro switch 72. The activation of the pyro switch 72 results in a non-resettable configuration of the system. If a short circuit occurs between the positive and negative sides during discharge upstream with respect to the power distribution panel 20, a very high short-circuit current is detected by both current sensors 15a and 15b and the fail-safe device interrupts the short circuit by opening contactor 17 and pyro switch 72.

Figure 13:
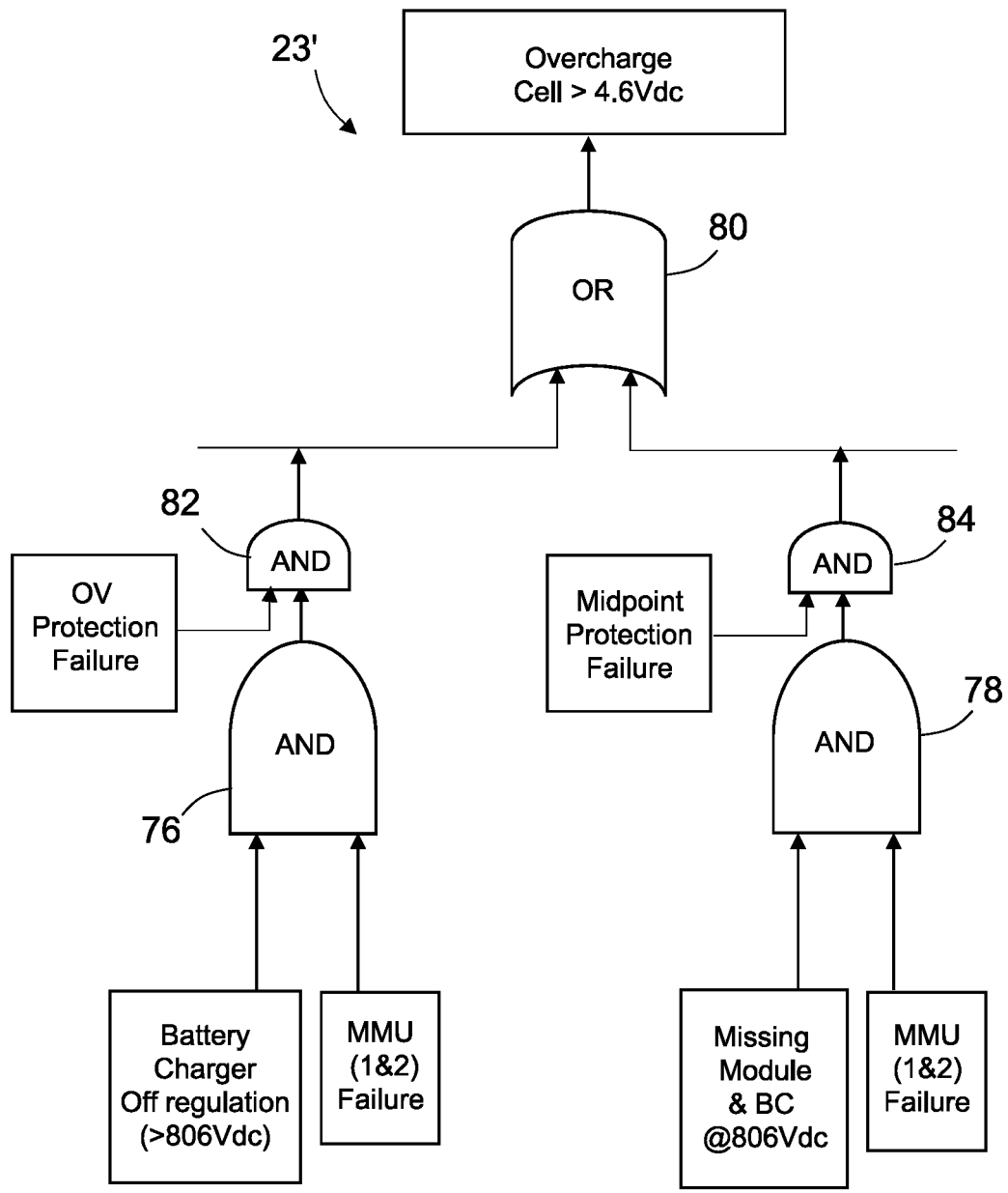
FIG. 13 is a diagram representing an improved battery cell overcharge fault tree that forms a basis for logic employed in another embodiment of the battery protection system proposed herein.

FIG. 13 is a diagram representing an improved battery cell overcharge fault tree 23' that forms a basis for logic employed to implement a fail-safe function in a redundant and dissimilar way. The logic is represented by AND gates 76, 78, 82, 84 and OR gate 80 in FIG. 4. The battery cell overcharge fault tree 23 is based on the assumption that a lithium-ion cell is normally to be charged to 4.2 $V_{DC}$ and should stay below 2.6 $V_{DC}$ during operation. Therefore, a battery module that consists of 192 cells connected in series (at this moment the number of parallel connections does not matter) should be charged to 192*4.2 $V_{DC}$=806 $V_{DC}$ (state of charge (SOC)=100%). If the battery charger goes off regulation (e.g., output voltage exceeds 806 $V_{DC}$) and both MMU1 and MMU2 malfunction (as two independent failures) and there is a failure of the over-voltage protection function, then the cells become overcharged to voltages higher than 4.6 $V_{DC}$. At this moment, nothing else prevents cells from being overcharged, overheated and eventually entering the thermal runaway regime. Another scenario is when one of the battery modules fails short across its terminals and both MMU1 and MMU2 malfunction and there is a failure of a communication between the fail-safe device and the mid-point resulting in a loss of protection. The charger continues providing 806 $V_{DC}$ but with fewer battery modules in series (e.g., with only seven modules instead of eight). In this case cells can also be overcharged and fail.

Figure 14:
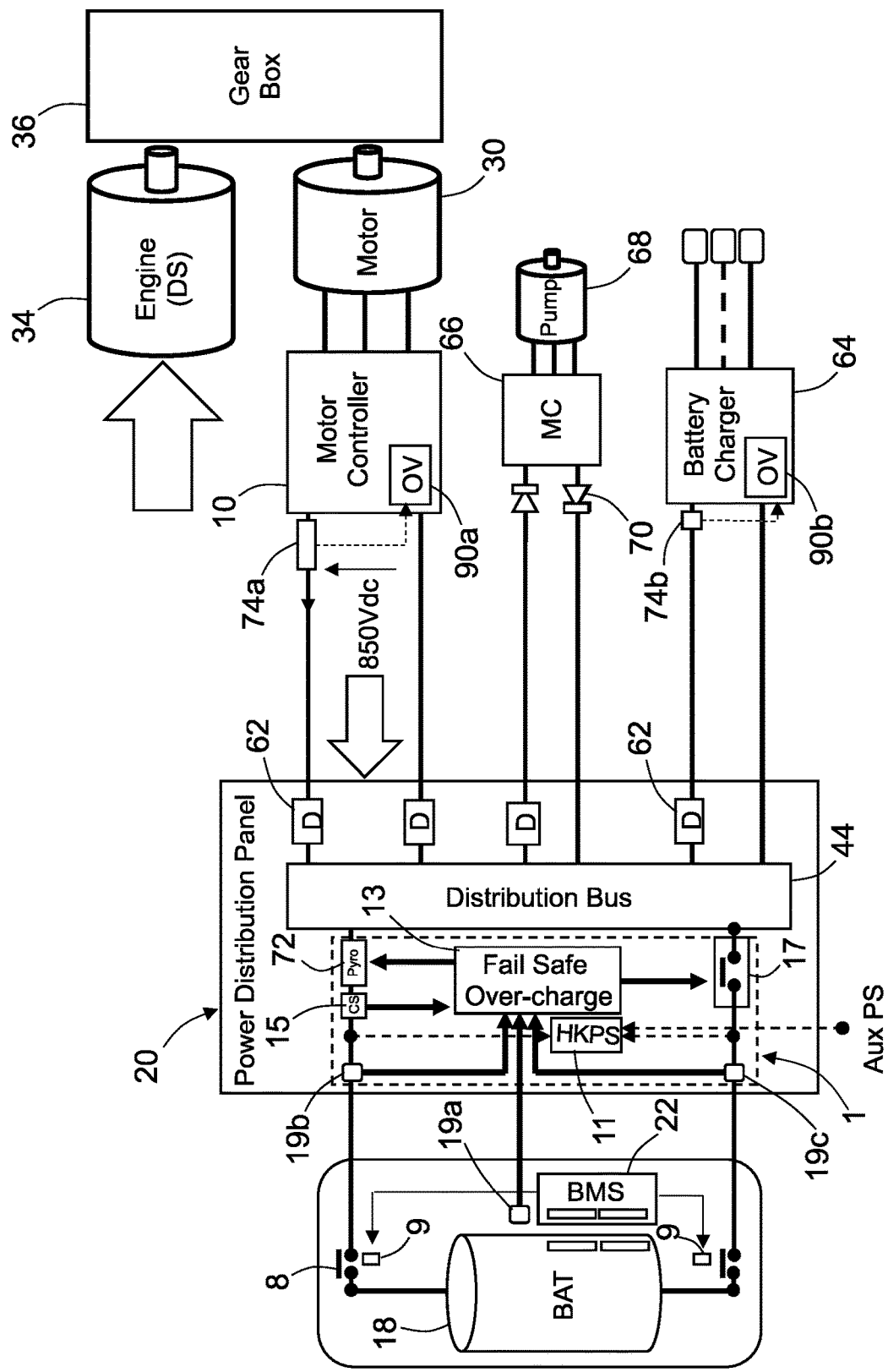
FIG. 14 is a diagram representing a hybrid-electric aircraft propulsion architecture of the type depicted in FIG. 9 with an additional layer of over-voltage protection incorporated in individual loads, which individual protection is invoked when failure of the load causes a regenerative mode that increases the battery voltage excessively.

FIG. 14 is a diagram representing a hybrid-electric aircraft propulsion architecture of the type depicted in FIG. 9 with an additional layer of independent over-voltage protection incorporated in individual loads, which individual protection is invoked when failure of the load causes a regenerative mode that increases the battery voltage excessively. Overvoltage (OV) protection is implemented in each one of a plurality of loads and other connections (e.g., the battery charger) to the power distribution bus 44. The difference in how protection is realized mainly depends on the type of equipment connected to the loads side of the system. If one load fails and produces regeneration, that load is preferably isolated before actuating the fail-safe device, thereby enabling the remaining healthy loads to keep operating.

In the example depicted in FIG. 14, the motor controller 10 includes an over-voltage protection circuit 90a. For example, when motor controller 10 is generating an over-voltage due to a failure, that over-voltage may be monitored by detecting when the voltage on its terminals exceeds a pre-set threshold value; in addition, a shunt-type current sensor 74a detects a negative current flowing out of the motor controller 10. In that case, the faulty motor controller is commanded to shut down. Similarly, the battery charger 64 also includes an over-voltage protection circuit 90b that receives sensor data from a shunt-type current sensor 74b.

In accordance with one embodiment, a segregated independent protection is embedded in each HVDC actively controlled load. This protection is implemented based on monitoring voltage and current and then applying logic to protect against failure due to loads creating excessive voltage or current back to the power distribution bus 44 and battery system 21. For load failure that could lead to bus and battery over-voltage, it could be advantageous to shut off the load, thereby creating a safe condition without interrupting service to other loads. In the case of a motor controller 10 which converts DC power into AC power for an AC motor, the regenerative mode driving bus voltage can be terminated by disabling the pulse-width modulation driver and/or the housekeeping power supply. For example, the over-voltage protection circuit 90a in motor controller 10 could be configured to activate protection when the regenerated voltage exceeds 850 $V_0c$. Then after a time delay, the fail-safe battery overcharge protection device 1 is configured to activate opening of contactor 17 when the regenerated voltage exceeds 865 $V_{DC}$ (if load protection fails). Then after a further time delay, the fail-safe battery overcharge protection device 1 is configured to activate the pyro switch 72 when the regenerated voltage exceeds 875 $V_{DC}$ (if the contactor fails to open). Thus, the fail-safe device layer may be set to higher levels for coordination to protect against load failure.

Figure 15:
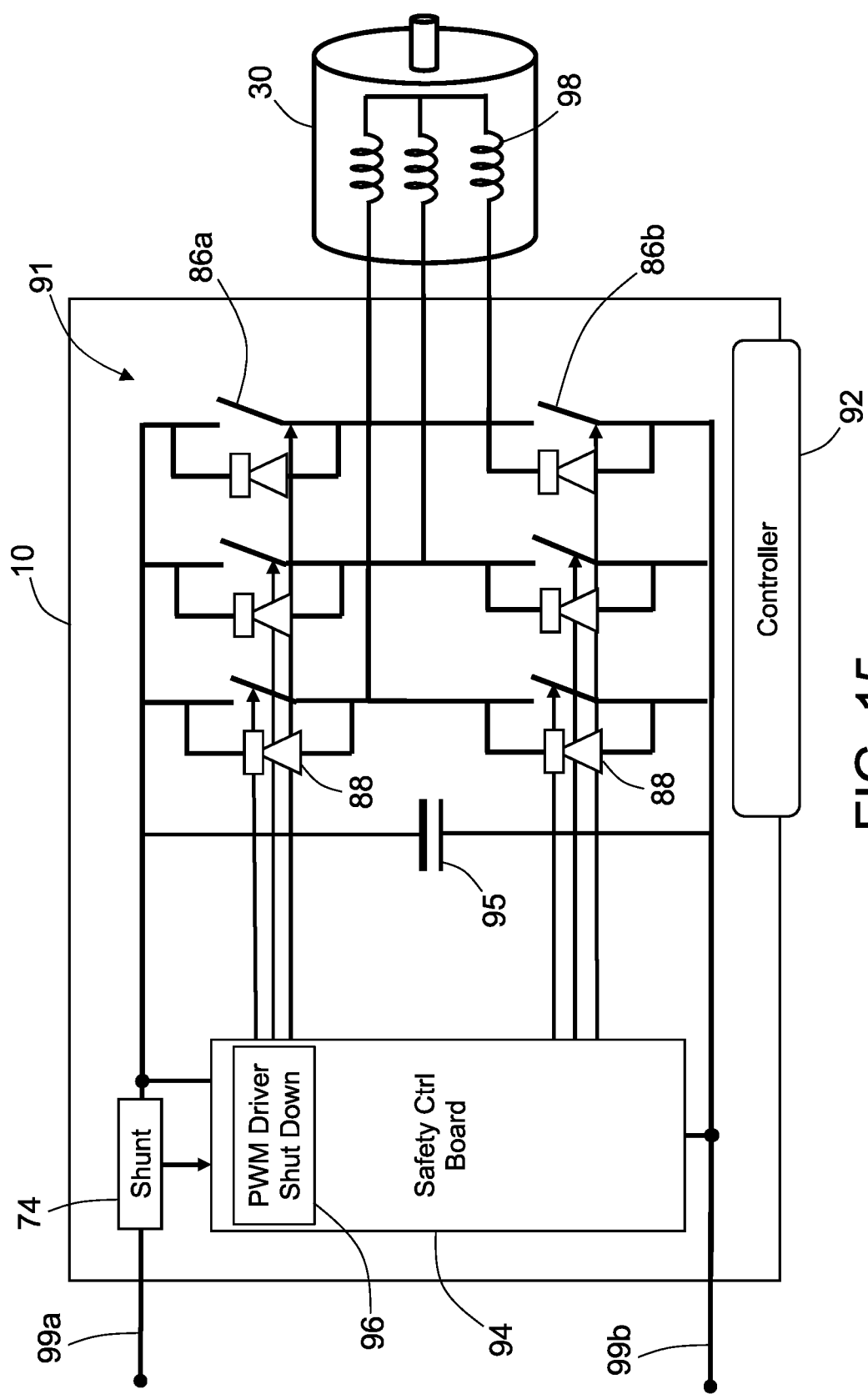
FIG. 15 is a diagram representing a motor controller electrically connected to a motor and incorporating a safety control board for protecting the battery from current regenerated by the motor in a failure mode.

FIG. 15 is a diagram representing a motor controller 10 electrically connected to an AC motor 30 and incorporating a safety control board 94 for protecting the battery (not shown in FIG. 15) from current regenerated by the AC motor 30 in a failure mode. The AC motor 30 operates under the control of the motor controller 10. In some implementations, the motor controller 10 has three channels for providing AC current to respective sets of stator windings 98 in the AC motor 30. Each channel of the motor controller 10 (only one channel is shown in FIG. 15) comprises a respective inverter 91 which is connected in parallel to windings 98 of the AC motor 30. In the simplified implementation depicted in FIG. 15, the channel includes an inverter 91 (including three sets of power switches 86 respectively associated with three phases) and a DC link capacitor 95 connected across the HVDC busbars 99a and 99b. A respective diode 88 is connected in anti-parallel with each power switch 86.

The operation of each inverter 91 is controlled by a respective inverter controller 92, which sends switch control signals to and receives switch state signals from the inverter 91 via switch signal lines (not shown in FIG. 15). The inverters 14 convert DC power into multi-phase AC power for the AC motor 30. The inverters and inverter controllers, in combination, form a DC-to-AC converter which is part of the motor controller 10. More specifically, the inverter controller 92 generates pulse width-modulated signals that serve as reference currents and voltages that need to be sourced to the AC motor 30 in order to achieve optimal mechanical torque output. These reference signals are modulated using a pulse width modulation (PWM) generation function which creates commands which are sent to the gate drivers of the power switches 86 in the inverter 91 controlled by the inverter controller 92.

In the scenario depicted in FIG. 15, the DC component of the regenerated electrical energy is being constantly fed back into the system by the motor controller 10. Typically, the battery receives this power at an acceptable level below overcharge conditions. However, under conditions wherein the AC motor 30 continues to spin at the same speed and there is nothing to counteract the generated motor back electromotive force (EMF), the motor back EMF suddenly increases. The regenerated voltage is then rectified through the freewheeling diodes 88 of the motor controller 10 and the resulting voltage is significantly higher than the DC link voltage provided by the battery system. When this happens, the motor 30 regenerates power back to the battery system uncontrollably. Since the battery is a low-impedance source and the regenerated power is significant, the result is a large current flowing back to the battery. This current can be much greater than the battery nominal charging current. This undesirable condition may lead to battery over-charge and subsequent over-heating and thermal runaway.

If an over-voltage and current flowing into the system are detected, the safety control board 94 is configured to determine that an overcharging condition exists and commands the power switches 86a and 86b (which may be, e.g., MOSFETs or IGBTs) to open by removing power from their gates, therefore isolating the load (in this case, AC motor 30) from the rest of the system. More specifically, the safety control board 94 may include a voltage transducer to measure the voltage across the DC link capacitor 95. A shunt-type current sensor 74 detects a negative current flowing out of the motor controller 10. The shutdown mechanism 96 is direct deactivation of the PWM drivers.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

The embodiments disclosed above use one or more processing or computing devices. Such devices typically include a processor, processing device, or controller, such as a general-purpose central processing unit, a microcontroller, a reduced instruction set computer processor, an application specific integrated circuit, a programmable logic circuit, a field-programmable gate array, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein.

The methods described herein may be encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

While systems and methods for providing redundant and dissimilar protection against overcharging of airborne high-voltage battery packs have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

In the method claims appended hereto, any alphabetic ordering of steps is for the sole purpose of enabling subsequent short-hand references to antecedent steps and not for the purpose of limiting the scope of the claim to require that the method steps be performed in alphabetic order.

The invention claimed is:

1. A system for charging a battery string that comprises a first half-string and a second half-string electrically connected at a mid-point, each half-string comprising a respective plurality of battery modules connected in series, each battery module comprising a respective plurality of battery cells, the system comprising:
   a first plurality of sensors connected to sense a full-string voltage measured across the battery string, a first half-string voltage measured across the first half-string, and a second half-string voltage measured across the second half-string;
   a mid-point battery disconnect subsystem connected to the mid-point, the mid-point battery disconnect subsystem comprising a mid-point disconnect device and a midpoint disconnect unit configured to control a state of the mid-point disconnect device;
   a failsafe overcharge system comprising a first disconnect device and a processor connected to receive sensor data from the first plurality of sensors during charging and send commands to the first disconnect device,
   a power distribution bus which is electrically connected to the battery string via the first disconnect device when the first disconnect device is closed; and
   a battery charger connected and configured to supply battery power to the power distribution bus for charging of the battery string,
       wherein the processor of the failsafe overcharge system is configured to send a command to open the first disconnect device when the sensor data from the first plurality of sensors indicates an undesirable electrical state during charging that would be mitigated by cessation of charging.

2. The system as recited in claim 1, wherein the processor of the failsafe overcharge system is programmed to derive a first measurement from the sensor data, compare the first measurement to a first threshold value, and send the command to open the first disconnect device when the first measurement exceeds the first threshold value.

3. The system as recited in claim 2, wherein the first measurement is a difference between the first half-string voltage and the second half-string voltage, and wherein the first threshold value is a difference threshold value.

4. The system as recited in claim 2, wherein the first measurement is a magnitude of the first half-string voltage and the first threshold value is a half-string voltage threshold value.

5. The system as recited in claim 2, wherein the first measurement is a magnitude of the full-string voltage and the first threshold value is a full-string voltage threshold value.

6. The system as recited in claim 2, further comprising a second disconnect device via which the power distribution bus is electrically connected to the battery string when the first disconnect device and the second disconnect device are closed, wherein the processor of the failsafe overcharge system is further programmed to derive a second measurement from the sensor data, compare the second measurement to a second threshold value which is higher than the first threshold value, and send a command to open the second disconnect device when the second measurement exceeds the second threshold value.

7. The system as recited in claim 6, wherein the first disconnect device is a contactor and the second disconnect device is a pyro switch.

8. The system as recited in claim 1, wherein the first plurality of sensors are voltage transducers.

9. The system as recited in claim 1, further comprising a power distribution panel, the first disconnect device, the power distribution bus, and the failsafe overcharge system being disposed on the power distribution panel.

10. The system as recited in claim 1, further comprising:
   a second plurality of sensors connected to sense battery cell voltage and temperature; and
   a battery management system coupled to the mid-point battery disconnect subsystem, the battery management system comprising a second disconnect device and a processor connected to receive sensor data from the second plurality of sensors during charging and send commands to the second disconnect device,
       wherein the power distribution bus is electrically connected to the battery string via the first and second disconnect devices when the first and second disconnect devices are closed; and
   wherein the processor of the battery management system is configured to send a command to open the second disconnect device when the sensor data from the second plurality of sensors indicates an undesirable electrical state during charging that would be mitigated by cessation of charging.

11. A system for charging a battery string that comprises a first half-string and a second half-string electrically connected at a mid-point, each half-string comprising a respective plurality of battery modules connected in series, each battery module comprising a respective plurality of battery cells, the system comprising:
   a first disconnect device;
   a second disconnect device;
   a power distribution bus which is electrically connected to the battery string via the first disconnect device and a second disconnect device when the first disconnect device and the second disconnect device are closed;
   a battery charger connected and configured to supply battery power to the power distribution bus for charging of the battery string;
   a module monitoring unit which is configured to sense individual battery cell voltages of the battery cells during charging;
   a first processor configured to activate the first disconnect device to open when the individual battery cell voltages sensed by the module monitoring unit indicate overcharging;
   a plurality of sensors connected to sense a full-string voltage measured across the battery string, a first half-string voltage measured across the first half-string, and a second half-string voltage measured across the second half-string;
   a mid-point battery disconnect subsystem connected to the mid-point and communicatively coupled to the module monitoring unit, the mid-point battery disconnect subsystem comprising a mid-point disconnect device and a midpoint disconnect unit configured to control a state of the mid-point disconnect device; and
   a second processor connected to receive sensor data from the plurality of sensors during charging and configured to activate the second disconnect device to open when the sensor data indicates overcharging.

12. The system as recited in claim 11, further comprising a housekeeping power supply configured to convert power from the battery string into power for activating the second disconnect device to open.

13. The system as recited in claim 11, wherein the second processor is programmed to:
   derive a first measurement from the sensor data,
   compare the first measurement to a first threshold value, and
   send a command to open the first disconnect device when the first measurement exceeds the first threshold value.

14. The system as recited in claim 13, wherein the first measurement is a difference between the first half-string voltage and the second half-string voltage, and wherein the first threshold value is a difference threshold value.

15. The system as recited in claim 13, wherein the first measurement is a magnitude of the first half-string voltage and the first threshold value is a half-string voltage threshold value.

16. The system as recited in claim 13, wherein the first measurement is a magnitude of the full-string voltage and the first threshold value is a full-string voltage threshold value.

17. The system as recited in claim 13, further comprising a third disconnect device via which the power distribution bus is electrically connected to the battery string when the first disconnect device, the second disconnect device, and the third disconnect device are closed, wherein the second processor is further programmed to:
   derive a second measurement from the sensor data,
   compare the second measurement to a second threshold value which is higher than the first threshold value, and
   send a command to open the third disconnect device when the second measurement exceeds the second threshold value.

18. The system as recited in claim 17, wherein the second disconnect device is a contactor and the third disconnect device is a pyro switch.

19. A method for charging a battery string that comprises a first half-string and a second half-string electrically connected at a mid-point, each half-string comprising a respective plurality of battery modules connected in series, each battery module comprising a respective plurality of battery cells, the method comprising:
   charging the battery string via a first disconnect device in a closed state;
   measuring a first half-string voltage across the first half-string during charging;
   measuring a second half-string voltage across the first half-string during charging;
   calculating a difference between the first half-string voltage and the second half-string voltage;
   comparing the difference to a difference threshold value;
   measuring a current flowing through a mid-point current sensor during charging when the mid-point current sensor is in a closed state, wherein the mid-point current sensor is disposed at the mid-point between the first half-string and the second half-string; and
   performing one or more of:
      issuing a first command to the first disconnect device to open in response to the difference being greater than the difference threshold value, or
      issuing a second command to the mid-point current sensor to open in response to a failure indicated by the mid-point current sensor.

20. The method as recited in claim 19, further comprising:
   measuring a full-string voltage across the battery string during charging;
   comparing a magnitude of the full-string voltage to a full-string voltage threshold value;
   comparing a magnitude of the first half-string voltage to a first half-string voltage threshold value; and
   comparing a magnitude of the second half-string voltage to a second half-string voltage threshold value.

21. The method as recited in claim 19, wherein charging the battery string comprises activating a battery charger which is connected to provide direct current to the battery string via the first disconnect device.

22. The method as recited in claim 19, wherein charging the battery string comprises supplying direct current to the battery string from a motor controller via the first disconnect device.

23. The method as recited in claim 19, further comprising activating a second disconnect device to open in response to failure of the first disconnect device to open.

* * * * *